(12) United States Patent
Shiratori

(10) Patent No.: US 10,263,218 B2
(45) Date of Patent: Apr. 16, 2019

(54) ELECTRO-OPTICAL DEVICE WITH A LUMINANCE ADJUSTMENT LAYER

(71) Applicant: SEIKO EPSON CORPORATION, Tokyo (JP)

(72) Inventor: Koya Shiratori, Nagano (JP)

(73) Assignee: SEIKO EPSON CORPORTION, Tokyo (JP)

( * ) Notice: Subject to any disclaimer, the term of this patent is extended or adjusted under 35 U.S.C. 154(b) by 0 days.

(21) Appl. No.: 15/412,700

(22) Filed: Jan. 23, 2017

(65) Prior Publication Data
US 2017/0229676 A1   Aug. 10, 2017

(30) Foreign Application Priority Data

Feb. 10, 2016 (JP) ................................. 2016-023398

(51) Int. Cl.
| | |
|---|---|
| *H01L 29/20* | (2006.01) |
| *H01L 21/00* | (2006.01) |
| *H01L 51/52* | (2006.01) |
| *H01L 27/32* | (2006.01) |
| *H01L 51/56* | (2006.01) |
| *G09G 3/3233* | (2016.01) |

(52) U.S. Cl.
CPC ...... *H01L 51/5265* (2013.01); *H01L 27/3211* (2013.01); *H01L 51/5206* (2013.01); *H01L 51/5271* (2013.01); *H01L 51/5275* (2013.01); *H01L 51/56* (2013.01); *G09G 3/3233* (2013.01); *G09G 2320/0271* (2013.01); *H01L 27/322* (2013.01); *H01L 27/3244* (2013.01); *H01L 27/3265* (2013.01); *H01L 27/3276* (2013.01); *H01L 2251/301* (2013.01); *H01L 2251/303* (2013.01)

(58) Field of Classification Search
CPC ............ H01L 51/5265; H01L 27/3211; H01L 51/5206; H01L 51/5271; H01L 51/5275; H01L 51/56
See application file for complete search history.

(56) References Cited

U.S. PATENT DOCUMENTS

| | | | | |
|---|---|---|---|---|
| 8,076,687 | B2 * | 12/2011 | Kobayashi | .......... H01L 51/5265 257/100 |
| 9,142,599 | B2 * | 9/2015 | Koshihara | ............. H01L 27/322 |

(Continued)

FOREIGN PATENT DOCUMENTS

| | | |
|---|---|---|
| JP | 2005-093399 A | 4/2005 |
| JP | 2012-248433 A | 12/2012 |

(Continued)

*Primary Examiner* — Alonzo Chambliss
(74) *Attorney, Agent, or Firm* — Oliff PLC

(57) ABSTRACT

An organic EL device as an the electro-optical device includes a reflective layer; an opposite electrode as a semi-transparent reflective layer; and a first luminescence pixel and a second luminescence pixel as first pixels, and a third luminescence pixel as a second pixel respectively having an optical path length adjustment layer and a functional layer provided between the reflective layer and the opposite electrode; in which the optical path length adjustment layer of the first luminescence pixel includes a fourth insulation layer as a luminance adjustment layer and the optical path length adjustment layer of the third luminescence pixel does not include a third insulation layer.

16 Claims, 13 Drawing Sheets

(56) References Cited

U.S. PATENT DOCUMENTS

| | | | |
|---|---|---|---|
| 2007/0015429 A1* | 1/2007 | Maeda | H01L 51/5206 445/24 |
| 2007/0075305 A1* | 4/2007 | Miyata | H01L 51/5203 257/13 |
| 2007/0102737 A1 | 5/2007 | Kashiwabara et al. | |
| 2010/0253222 A1* | 10/2010 | Koshihara | H01L 51/5265 315/32 |
| 2011/0241038 A1 | 10/2011 | Kashiwabara et al. | |
| 2012/0229014 A1* | 9/2012 | Shiratori | H01L 27/3216 313/498 |
| 2013/0207138 A1 | 8/2013 | Kashiwabara et al. | |
| 2014/0295597 A1 | 10/2014 | Sato et al. | |
| 2014/0332832 A1 | 11/2014 | Kashiwabara et al. | |
| 2014/0361316 A1 | 12/2014 | Nozawa et al. | |
| 2015/0060807 A1 | 3/2015 | Koshihara et al. | |
| 2015/0118774 A1 | 4/2015 | Sato et al. | |
| 2015/0295017 A1 | 10/2015 | Kashiwabara et al. | |
| 2016/0293673 A1 | 10/2016 | Kashiwabara et al. | |
| 2017/0154932 A1 | 6/2017 | Kashiwabara et al. | |

FOREIGN PATENT DOCUMENTS

| | | | | |
|---|---|---|---|---|
| JP | 2013-045752 A | 3/2013 | | |
| JP | 2014-191962 A | 10/2014 | | |
| JP | 2014-235959 A | 12/2014 | | |
| JP | 2014235959 A | * 12/2014 | ......... | H01L 51/5265 |
| JP | 2015-046239 A | 3/2015 | | |
| JP | 5760699 B2 | 8/2015 | | |

* cited by examiner

| | CURRENT CONSUMPTION OF WHITE DISPLAY [mA] | | | CURRENT RATIO OF WHITE DISPLAY (%) | | | LUMINANCE LIFETIME LT80(H) | CHROMINANCE (Δu'v') |
|---|---|---|---|---|---|---|---|---|
| | BLUE | GREEN | RED | BLUE | GREEN | RED | | |
| COMPARATIVE EXAMPLE 1 | 48.5 | 16.1 | 15.6 | 60.5 | 20.1 | 19.4 | 2499 | 0.041 |
| EXAMPLE 1 | 39.3 | 18.3 | 17.9 | 52.0 | 24.2 | 23.8 | 2629 | 0.030 |
| EXAMPLE 2 | 38.8 | 28.6 | 42.8 | 35.2 | 26.0 | 38.8 | 1268 | 0.010 |

ELECTRO-OPTICAL DEVICE WITH A LUMINANCE ADJUSTMENT LAYER

BACKGROUND

1. Technical Field

The present invention relates to a self-luminous type electro-optical device including an optical resonance structure and electronic equipment.

2. Related Art

As an electro-optical device, an organic electroluminescence (EL) device configured to have an organic EL element which is a luminescence element for each pixel is known. In this organic EL device, a color display can be realized by obtaining light having a resonant wavelength with installation of an optical resonance structure for a pixel.

For example, an electro-optical device including a functional layer having a reflective layer, photoreflectance or a light transmitting opposite electrode, an insulation layer between the reflective layer and the opposite electrode, a pixel electrode, and a luminescence layer for a pixel is disclosed in JP-A-2014-235959. In the electro-optical device of JP-A-2014-235959, an optical resonance structure is provided in which the insulation layer has a first insulation layer, a second insulation layer, and a third insulation layer stacked in this order from the reflective layer side and a layer structure of an insulation layer between a reflective layer and a pixel electrode is changed for each pixel. That is, an optical path length in the optical resonance structure is adjusted by changing a configuration of an insulation layer for each pixel, thereby obtaining light with a desired resonant wavelength.

In the electro-optical device of JP-A-2014-235959, an example in which white luminescence is obtained from the functional layer provided in each pixel is shown. Also, an example in which color filters are arranged in each pixel is shown. That is, light with the resonant wavelength of the white light emitted from the functional layer of an organic EL element is intensified by the optical resonance structure and is obtained through a color filter.

For example, in each of pixels in which the different luminescence colors of blue (B), green (G), and red (R) are obtained, it is difficult to strictly control a luminescence intensity, in order to obtain light of the same luminescence intensity from each pixel, a magnitude of a current flowing through the organic EL element may be different for each pixel of the colors of the B, G, and R. Thus, the current ratio between pixels of the colors of B, G, and R may be different from each other. Therefore, if an electro-optical device is driven over a long period, the luminescence luminance of the organic EL element in the pixel through which the most current has flowed may be decreased as compared with the other pixels. Therefore, when white color is displayed due to emission from the pixels of the colors of B, G, and R, there is a problem that a chromaticity deviation due to a decrease of the luminescence luminance of one pixel may occur.

Further, in order to uniformize the current ratio between the pixels, a method of, for example, changing the characteristics of the transistors for each pixel or changing a circuit configuration has been considered, but there is a problem that the circuit configuration becomes complicated.

SUMMARY

The invention can be realized in the following aspects or application examples.

Application Example

According to this application example, there is provided an electro-optical device including a reflective layer; a semitransparent reflective layer; and a first pixel and a second pixel respectively having an optical path length adjustment layer and a luminescence functional layer provided between the reflective layer and the semitransparent reflective layer; in which the optical path length adjustment layer of the first pixel includes a luminance adjustment layer and the optical path length adjustment layer of the second pixel does not include the luminance adjustment layer.

According to this application example, in a case where the same luminescence luminance is obtained in the first pixel and the second pixel, since the first pixel includes the luminance adjustment layer, it is necessary that much more current flows through the first pixel as compared with through the second pixel. In other words, in the first pixel and the second pixel, for example, even in a case where the magnitudes of the currents flowing through the luminescence functional layers for the same luminescence luminance are different from each other, the current flowing through the first pixel is increased with respect to that in the second pixel and the luminescence of substantially the same luminance can be obtained from the first pixel and the second pixel. That is, a difference between the magnitudes of the currents flowing through the first pixel and the second pixel can be reduced or the magnitudes of the current can be made equal. Thus, it is possible to provide the electro-optical device in which the current ratio between the pixels can be uniformized with a simple configuration without a complicated circuit configuration in a pixel circuit.

In the electro-optical device according to the application example, the optical path length adjustment layer preferably includes a transparent pixel electrode, and the luminance adjustment layer is preferably provided between the reflective layer and the pixel electrode.

According to this configuration, a difference between the magnitudes of the current flowing through the first pixel and the second pixel can be reduced or the magnitudes of the currents can be made to be equal without affecting luminescence properties of the luminescence functional layer provided between the pixel electrode and the semitransparent reflective layer.

In the electro-optical device according to the application example, the luminance adjustment layer preferably includes a layer with a lower refractive index than the refractive indexes of adjacent layers.

According to this configuration, it is possible to adjust the amount of light transmitted through the luminance adjustment layer using a difference in refractive index between the adjacent layers.

In the electro-optical device according to the application example, the luminance adjustment layer may include the layer with the lower refractive index than the refractive indexes of the adjacent layers and a metal layer.

According to this configuration, it is possible to adjust the luminance by using photoreflectance at the interfaces of the metal layer.

In the electro-optical device according to the application example, the metal layer is made of at least one metal selected from among Ti, Mo, Ta, Al, Cu, and Cr, or an alloy of these metals.

According to this configuration, the metal layer can be configured to have a light transmission property and photoreflectance when it is a metal thin film using these metals or an alloy, and can impart a luminance adjustment function.

In the electro-optical device according to the application example, the adjacent layers are made of a silicon nitride film and the layer with a lower refractive index is made of a silicon oxide film.

According to this configuration, since the luminance adjustment layer includes a layer made of a silicon oxide film, a rapid decrease of the luminance is prevented by the luminance adjustment layer and it is possible to adjust the luminance precisely.

In the electro-optical device according to the application example, the first pixel and the second pixel preferably include a reflection-increasing layer provided on the reflective layer.

According to this configuration, it is possible to realize a higher luminescence luminance in the first pixel and the second pixel.

Application Example

According to this application example, there is provided electronic equipment including the electro-optical device according to the application example.

According to the application example, since an electro-optical device that is able to unify the current ratio between the pixels in a simple configuration without a complicated circuit configuration in a pixel circuit is provided, it is possible to provide electronic equipment which realizes a state of high-quality luminescence with excellent cost performance.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments according to the invention will be described with reference to the drawings. Additionally, the used drawings may be appropriately enlarged or reduced in order to display parts to be described in a recognizable state.

First Embodiment

Electro-Optical Device

Figure 1:
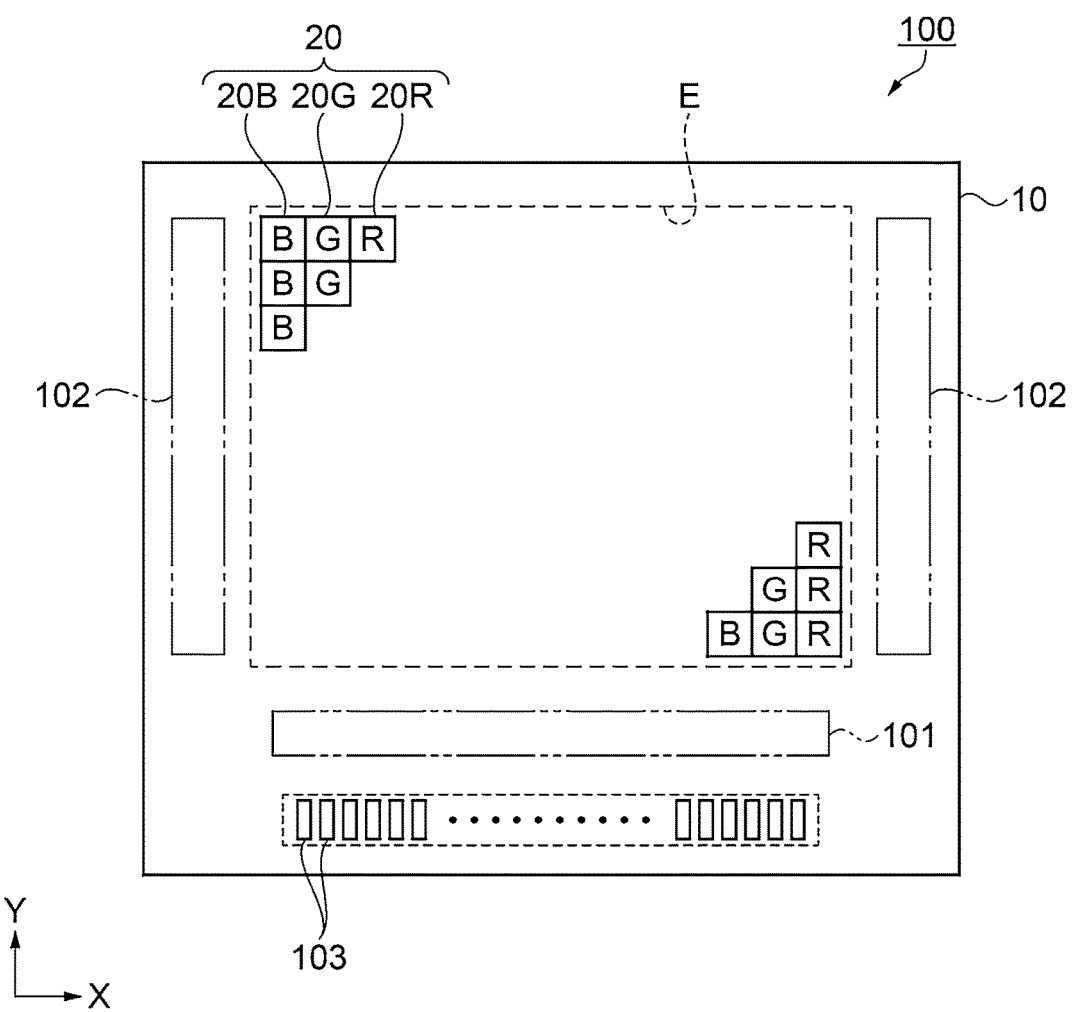
FIG. 1 is a schematic plan view illustrating a configuration of an organic EL device according to a first embodiment.
Figure 2:
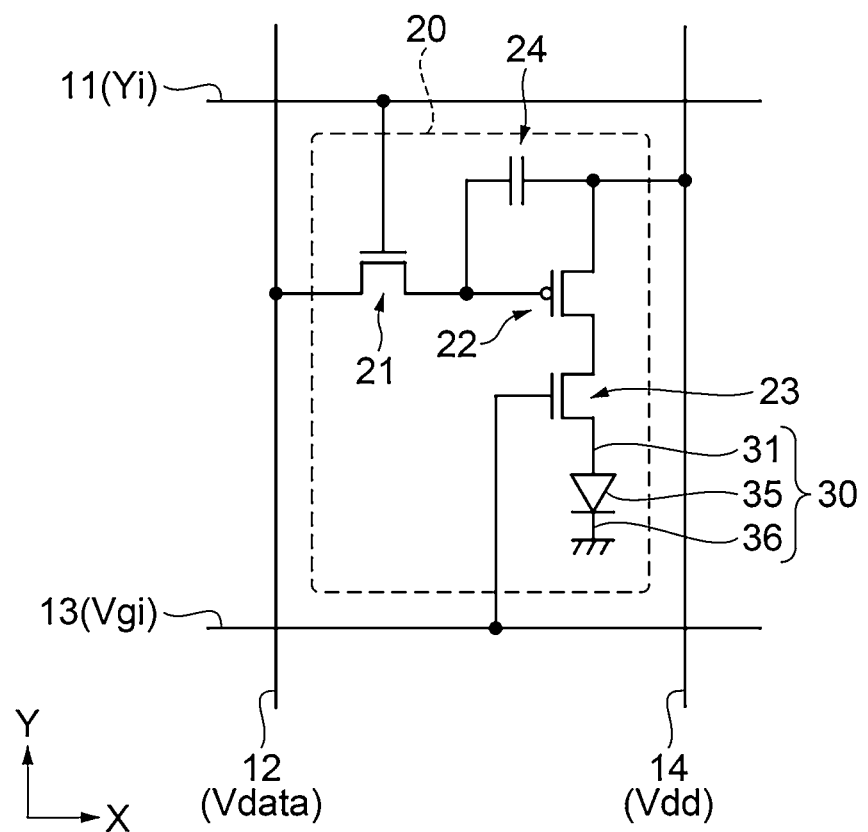
FIG. 2 is an equivalent circuit diagram illustrating an electrical configuration of a luminescence pixel of the organic EL device according to the first embodiment.
Figure 3:
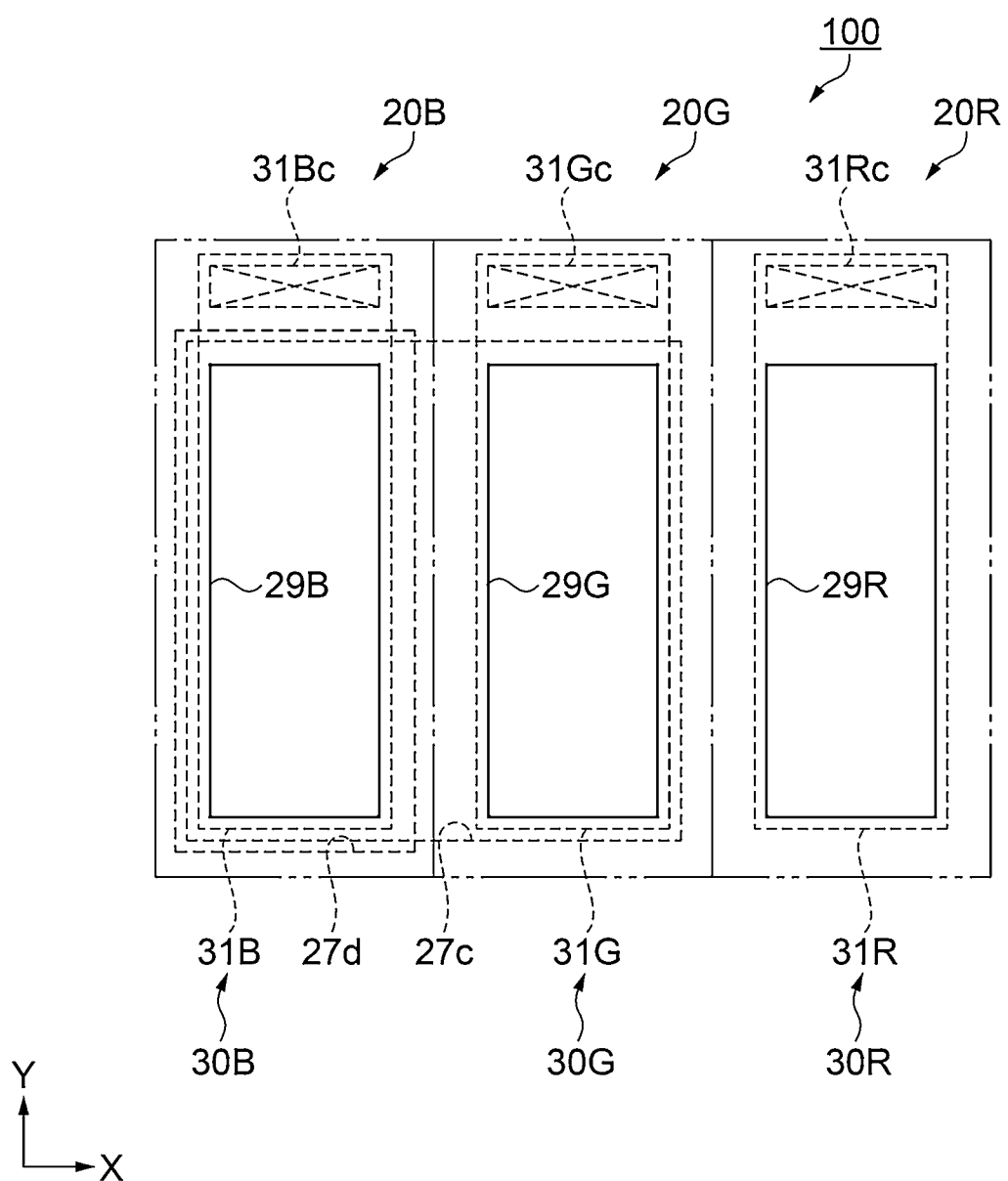
FIG. 3 is a schematic plan view illustrating a configuration of the luminescence pixel of the organic EL device according to the first embodiment.

First, an example of an organic EL device as an electro-optical device of this embodiment will be described with reference to FIGS. 1 to 5. FIG. 1 is a schematic plan view illustrating a configuration of an organic EL device, FIG. 2 is an equivalent circuit diagram illustrating an electrical configuration of a luminescence pixel of the organic EL device, and FIG. 3 is a schematic plan view illustrating a configuration of the luminescence pixel of the organic EL device.

As illustrated in FIG. 1, an organic EL device 100 includes an element substrate 10, a plurality of luminescence pixels 20 arranged in a matrix in a display region E of the element substrate 10, a data line driving circuit 101 and a scanning line driving circuit 102 which are peripheral circuits which drive and control the plurality of luminescence pixels 20, and a plurality of external connection terminals 103 for an electrical connection to an external circuit, as an electro-optical device. The organic EL device 100 according to this embodiment is an active drive type luminescence device or a top emission type luminescence device.

A luminescence pixel 20B in which blue (B) luminescence is obtained, a luminescence pixel 20G in which green (G) luminescence is obtained, and a luminescence pixel 20R in which red (R) luminescence is obtained are arranged in the display region E. The luminescence pixels 20 in which luminescence of a same color is obtained are arranged in the vertical direction on FIG. 1, the luminescence pixels 20 in which luminescence of different colors is obtained are arranged repeatedly in the horizontal direction in the order of B, G, and R on FIG. 1. This arrangement of the luminescence pixels 20 is referred to as a stripe type, but the invention is not limited thereto. For example, the luminescence pixels 20 in which luminescence of different colors is obtained may not be arranged in the horizontal direction in the order of B, G, and R, and may be arranged in the horizontal direction in the order of R, G, and B.

In the description below, the vertical direction in which the luminescence pixels 20, in which luminescence of the same color is obtained, are arranged will be referred to as a Y-direction, the direction perpendicular to the Y-direction will be referred to as an X-direction. When viewing the element substrate 10 from a direction in which light of the luminescence pixel 20 is obtained, it will be described as a plan view.

Although the detailed configuration of the luminescence pixel 20 will be described below, the luminescence pixels 20B, 20G, and 20R according to this embodiment include an organic electroluminescence element (hereinafter, referred to as an organic EL element) and include a color filter of each color of B, G, and R respectively as a luminescence element, and convert the luminescence from the organic EL element to each color of B, G, and R to allow full color display. Further, an optical resonance structure in which luminance with a specific wavelength in a range of a luminescence wavelength of the organic EL element is intensified is built to each of the luminescence pixels 20B, 20G, and 20R.

In the organic EL device 100, the luminescence pixels 20B, 20G, and 20R function as a sub-pixel, and one pixel unit is configured to have three luminescence pixels 20B, 20G, and 20R in which luminescence corresponding to B, G, and R is obtained in order to display an image. The configuration of the pixel unit is not limited thereto, and the pixel unit may have the luminescence pixel 20 in which luminescence color (including white color) other than B, G, or R is obtained.

The plurality of external connection terminals 103 are arranged in the X-direction along a first side portion of the element substrate 10. The data line driving circuit 101 is disposed between the external connection terminals 103 and the display region E in the Y-direction and extends in the X-direction. Also, a pair of scanning line driving circuits 102 are disposed in the X-direction with the display region E being interposed between the pair of the scanning line driving circuits 102.

As described above, the plurality of luminescence pixels 20 are arranged in a matrix in the display region E, and a scanning line 11, a data line 12, a lighting control line 13, and a power supply line 14 are disposed on the element substrate 10 as signal lines corresponds to the luminescence pixel 20 as shown in FIG. 2.

In this embodiment, the scanning line 11 and the lighting control line 13 extend in the X-direction parallel to each other, and the data line 12 and the power supply line 14 extend in the Y-direction parallel to each other.

In the display region E, a plurality of the scanning lines 11 and the lighting control lines 13 are arranged in accordance with m columns of the plurality of luminescence pixels 20 arranged in a matrix, and each of the scanning lines 11 and the lighting control lines 13 is connected to a pair of the scanning line driving circuits 102 shown in FIG. 1. A plurality of the data lines 12 and the power supply lines 14 are arranged in accordance with n rows of the plurality of luminescence pixels 20 arranged in a matrix, each of the data lines 12 is connected to the data line driving circuit 101 shown in FIG. 1, and a plurality of the power supply lines 14 are connected to any one of the plurality of the external connection terminals 103.

A first transistor 21, a second transistor 22, a third transistor 23, a storage capacitor 24, and an organic EL element 30 as the luminescence element configuring a pixel circuit of the luminescence pixel 20 are provided near an intersection between the scanning line 11 and the data line 12.

The organic EL element 30 includes a pixel electrode 31 which is an anode, an opposite electrode 36 which is a cathode, and a functional layer 35 having a luminescence layer sandwiched between the pixel electrode 31 and the opposite electrode 36. The opposite electrode 36 is an electrode provided in common in the plurality of luminescence pixels 20, and for example, the potential of a low-level reference potential Vss or GND is applied to a power supply voltage Vdd applied to the power supply line 14.

The first transistor 21 and the third transistor 23 are, for example, n-channel type transistors. The second transistor 22 is, for example, a p-channel type transistor.

A gate electrode of the first transistor 21 is connected to the scanning line 11, one current terminal is connected to the data line 12 and the other current terminal is connected to a gate electrode of the second transistor 22 and one electrode of the storage capacitor 24.

One current terminal of the second transistor 22 is connected to the power supply line 14 and the other electrode of the storage capacitor 24. The other current terminal of the second transistor 22 is connected to one current terminal of the third transistor 23. In other words, the second transistor 22 and the third transistor 23 share one current terminal among the pair of current terminals.

A gate electrode of the third transistor 23 is connected to the lighting control line 13 and the other current terminal is connected to the pixel electrode 31 of the organic EL element 30.

One side of the pair of current terminals in each of the first transistor 21, the second transistor 22, and the third transistor 23 is a source and the other side of the pair of current terminals is a drain.

In such a pixel circuit, when a voltage level of a scanning signal Yi supplied from the scanning line driving circuit 102 to the scanning line 11 becomes a Hi level, a state of the first transistor 21 of the n-channel type becomes an on state (ON). The data line 12 and the storage capacitor 24 are electrically connected with each other through the first transistor 21 in the on state (ON). Also, if a data signal is supplied from the data line driving circuit 101 to the data line 12, a potential difference between a voltage level Vdata of the data signal and the power supply voltage Vdd which is applied to the power supply line 14 is accumulated in the storage capacitor 24.

If the voltage level of the scanning signal Yi which is applied from the scanning line driving circuit 102 to the scanning line 11 becomes a Low level, the state of the first transistor 21 of the n-channel type becomes an off state (OFF), and a voltage Vgs between the gate and source of the second transistor 22 is held at a voltage when the voltage level Vdata is applied. After the scanning signal Yi becomes the Low level, a voltage level of a lighting control signal Vgi which is supplied to the lighting control line 13 becomes the Hi level, and the state of the third transistor 23 becomes the on state (ON). Then, between the source and drain of the second transistor 22, the current flows depending on the voltage Vgs between the gate and the source of the second transistor 22. Specifically, this current flows through a path from the power supply line 14 to the organic EL element 30 via the second transistor 22 and the third transistor 23.

The organic EL element 30 emits light in accordance with the magnitude of the current flowing through the organic EL element 30. The current flowing through the organic EL element 30 is set by a operating point of the second transistor 22 and the organic EL element 30 set at the voltage Vgs between the gate and the source of the second transistor 22. The voltage Vgs between the gate and the source of the second transistor 22 is a voltage held in the storage capacitor 24 by the potential difference between the voltage level Vdata of the data line 12 and the power supply voltage Vdd when the scanning signal Yi becomes the Hi level. In this way, the luminescence luminance of the luminescence pixel 20 is defined by the voltage levels Vdata of the data signal and a length of a period during which the third transistor 23 is turned on. That is, it is possible to apply a gradation of the luminance in accordance with image information of the luminescence pixel 20 by a value of the voltage level Vdata of the data signal, and it is possible to display a full color.

In this embodiment, the pixel circuit of the luminescence pixel 20 is not limited to have the three transistors 21, 22, and 23, and may be configured to have a switching transistor and a driving transistor. The pixel circuit may be configured to have the n-channel tape transistor or the p-channel type transistor or both of the n-channel type transistors and the p-channel type transistor. Also, the pixel circuit of the luminescence pixel 20 may be configured to have a MOS transistor having an active layer on a semiconductor substrate or a thin film transistor or a field-effect transistor.

The lighting control line 13 and the power supply line 14 which are the signal lines other than the scanning line 11 and the data line 12 are arranged by positions of the transistor and the storage capacitor 24, but the invention is not limited thereto.

In this embodiment, an example adapting the MOS transistor having an active layer on a semiconductor substrate as the transistor for the configuration of the pixel circuit of the luminescence pixel 20 will be described below.

Configuration of Luminescence Pixel

The configuration of the luminescence pixel 20 will be described in detail with reference to FIG. 3. As shown in FIG. 3, each of the luminescence pixels 20B, 20G, and 20R has a rectangular shape in the plan view, and a longitudinal direction thereof is disposed along the Y-direction. The organic EL elements 30 of the equivalent circuit shown in FIG. 2 are provided in each of the luminescence pixels 20B, 20G, and 20R. Also, in order to distinguish the organic EL elements 30 provided in each of the luminescence pixels 20B, 20G, and 20R, the organic EL elements 30 will be described as organic EL elements 30B, 30G, and 30R. Also, in order to distinguish the pixel electrodes 31 of the organic EL elements 30 for each of the luminescence pixels 20B, 20G, and 20R, the pixel electrodes 31 will be described as pixel electrodes 31B, 31G, and 31R.

The luminescence pixel 20B is provided with the pixel electrode 31B and a contact unit 31Bc which is electrically connected to the pixel electrode 31B and the third transistor 23. Similarly, the luminescence pixel 20G is provided with the pixel electrode 31G and a contact unit 31Gc which is electrically connected to the pixel electrode 31G and the third transistor 23. The luminescence pixel 20R is provided with the pixel electrode 31R and a contact unit 31Rc which is electrically connected to the pixel electrode 31R and the third transistor 23.

Each of the pixel electrodes 31B, 31G, and 31R is also substantially a rectangular shape in the plan view, and each of the contact units 31Bc, 31Gc, and 31Rc is disposed on the upper side of the longitudinal direction of each of the pixel electrodes 31B, 31G, and 31R.

Figure 4:
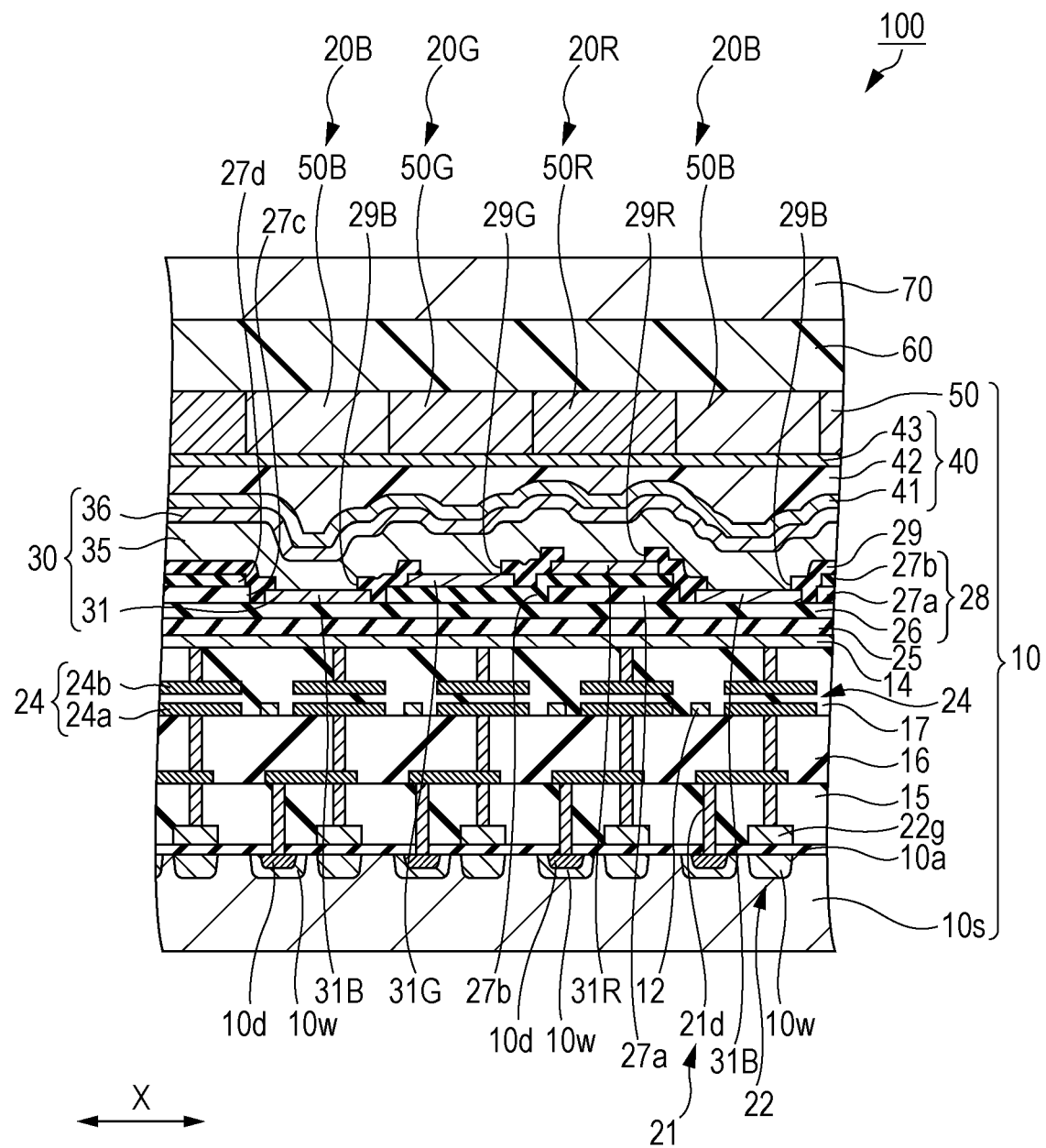
FIG. 4 is a schematic cross-sectional view illustrating a configuration taken along the luminescence pixel in a X-direction.

Each of the luminescence pixels 20B, 20G, and 20R is electrically insulated from the group of the adjacent pixel electrodes 31, and has an insulation structure in which openings 29B, 29G, and 29R which define a region in contact with the functional layer 35 on the pixel electrodes 31B, 31G, and 31R are provided (see FIG. 4).

Parts in contact with the functional layer 35 on the pixel electrodes 31B, 31G, and 31R functions substantially as the pixel electrodes 31B, 31G, and 31R injecting an electric charge into the functional layer 35 of the organic EL elements 30B, 30G, and 30R, and each of the parts is defined by the opening 29B, 29G, and 29R in the insulation structure. The openings 29B, 29G, and 29R are defined by a fifth insulation layer 29 (see FIG. 4) to be described later, each of the contact units 31Bc, 31Gc, and 31Rc in each of the pixel electrodes 31B, 31G, and 31R is covered by the fifth insulation layer 29, and the contact units 31Bc, 31Gc, and 31Rc are insulated from each other. In this embodiment, the openings 29B, 29G, and 29R have the same shape and size.

Next, the structure of the luminescence pixel 20 will be described with reference to FIG. 4. FIG. 4 is a schematic cross-sectional view illustrating a structure of the luminescence pixel cut along the X-direction. In FIG. 4, the first transistor 21, and the second transistor 22, a wiring with regard to the first transistor 21, and the second transistor 22, or the like in the pixel circuit are shown, and the third transistor 23 is not shown.

As shown in FIG. 4, the organic EL device 100 includes the element substrate 10 configured to have the luminescence pixels 20B, 20G, 20R, and a color filter 50 or the like and a transparent sealing substrate 70. The element substrate 10 and the sealing substrate 70 are bonded with each other by a resin layer 60 having adhesiveness and transparency. The color filter 50 has filter layers 50B, 50G, and 50R corresponding to each color of B, G, and R. The filter layers 50B, 50G, and 50R in the element substrate 10 are respectively disposed in correspondence with each of the luminescence pixels 20B, 20G, and 20R. The light created in the functional layer 35 transmits through one of the corresponding filter layers 50B, 50G, and 50R to be emitted from the sealing substrate 70 side. That is, the organic EL device 100 has a top emission structure in which the luminescence is obtained from the sealing substrate 70 side.

Since the organic EL device 100 has the top emission structure, it is possible to use an opaque ceramic substrate or a semiconductor substrate for a base material 10s of the element substrate 10 in addition to a transparent glass substrate.

In this embodiment, the semiconductor substrate is used as the base material 10s. For example, the semiconductor substrate is a silicon substrate.

A well unit 10w which is formed by injecting an ion into the semiconductor substrate and an ion injection unit 10d which is an active layer and which is formed by injecting a different ion from the well unit 10w into the well unit 10w are provided on the base material 10s. The well unit 10w functions as a channel of the transistors 21, 22, and 23 in the luminescence pixel 20, and the ion injection unit 10d functions as the source and drain of the transistors 21, 22 and 23 and a part of the wiring in the luminescence pixel 20.

Next, a insulating film 10a covering the surface of the base material 10s in which the ion injection unit 10d and the well unit 10w are formed is formed. The insulating film 10a functions as a gate insulating film. For example, a conductive film, such as polysilicon, is deposited on the insulating film 10a, and a gate electrode 22g is formed by patterning the conductive film. The gate electrode 22g is disposed so as to face the well unit 10w which functions as a channel of the second transistor 22. The gate electrode is also disposed in the first transistor 21 and the third transistor 23 in the same manner.

Next, a first interlayer insulating film 15 covering the gate electrode 22g is formed. Then, for example, a contact hole is formed by penetrating through the first interlayer insulating film 15, and reaches to the drain of the first transistor 21 and the gate electrode 22g of the second transistor 22. The conductive film is deposited so as to cover at least the inside of the contact hole and the surface of the first interlayer insulating film 15, and for example, the wiring connected to a drain electrode 21d of the first transistor 21 and a gate electrode 22g of the second transistor 22 is formed by patterning the conductive film.

Next, a second interlayer insulating film 16 for covering the various wirings on the first interlayer insulating film 15 is formed. Then, a contact hole is formed by penetrating through the second interlayer insulating film 16, and reaches the wiring formed on the first interlayer insulating film 15. The conductive film is deposited so as to cover at least the inside of the contact hole and the surface of the second interlayer insulating film 16, and for example, the contact unit electrically connected to one electrode 24a of the storage capacitor 24 and the gate electrode 22g of the second transistor 22 is formed by patterning the conductive film. Further, the data line 12 is formed on the same layer of one electrode 24a. The data line 12 is connected to the source of the first transistor 21 by the wiring which is not illustrated in FIG. 4.

Next, a dielectric layer covering at least one electrode 24a (not shown in FIG. 4) is formed. The other electrode 24b of the storage capacitor 24 is formed in a position opposed to one electrode 24a with the dielectric layer being interposed between the electrode 24a and the electrode 24b. By this, the storage capacitor 24 having the dielectric layer between a pair of the electrodes 24a and 24b is formed.

Next, a third interlayer insulating film 17 covering the data line 12 and the storage capacitor 24 is formed. Then, a contact hole is formed by penetrating through the third interlayer insulating film 17, and reaches the wiring formed on the second interlayer insulating film 16 and the other electrode 24b of the storage capacitor 24. The conductive film is deposited so as to cover at least the inside of the contact hole and the surface of the third interlayer insulating film 17, and the power supply line 14 is formed and the contact unit connected to the power supply line 14 and the other electrode 24b is formed, by patterning the conductive film. In the embodiment, the power supply line 14 is photoreflectance and electrically conductive, and is formed by, for example, metal such as Al (aluminum) or Ag (silver) or alloy of these metals. The power supply line 14 is formed to configure a plane over the display area E, the plane facing the pixel electrodes 31B, 31G, and 31R, except the portion which overlaps with the contact units 31Bc, 31Gc, and 31Rc of the luminescence pixels 20B, 20G, and 20R (see FIG. 3). The portion facing the pixel electrodes 31B, 31G, and 31R of the power supply line 14 functions as the reflective layer.

The power supply line 14 may be formed of a conductive material, and the reflective layer may be provided between the power supply line 14 and the pixel electrodes 31B, 31G, and 31R.

Although not shown in FIG. 4, the well unit 10w which is shared by the second transistor 22 and third transistor 23 is provided on the base material 10s. Three ion injection units 10d are provided in the well unit 10w. The ion injection unit 10d located at the center side of the three ion injection units 10d functions as a drain to be shared by the second transistor 22 and third transistor 23. The insulating film 10a covering the well unit 10w is provided. Then, the conductive film, for example, such as polysilicon is deposited to cover the insulating film 10a, and by patterning the conductive film, the gate electrode of the second transistor 22 and the gate electrode of the third transistor 23 are formed on the insulating film 10a. Each of the gate electrodes is disposed to face a part which functions as a channel for the well unit 10w between the center side ion injection unit 10d and the end side ion injection unit 10d.

Next, the gate electrode of the second transistor 22 is connected to one electrode 24a of the storage capacitor 24 provided on the second interlayer insulating film 16 by the contact hole penetrating through the first interlayer insulating film 15 and the second interlayer insulating film 16. The source electrode of the second transistor 22 is connected to the power supply line 14 provided on the third interlayer insulating film 17 by the contact hole penetrating through the second interlayer insulating film 16 and the third interlayer insulating film 17.

The gate electrode of the third transistor 23 is connected to the lighting control line 13 provided on the first interlayer insulating film 15 by the contact hole penetrating through the first interlayer insulating film 15. The scanning line 11 is provided on the first interlayer insulating film 15 in addition to the lighting control line 13. The scanning line 11 is connected to the gate of the first transistor 21 in the same manner via the contact hole penetrating through the first interlayer insulating film 15.

The source electrode of the third transistor 23 is connected to the wiring provided on the insulation layer 28 by the contact hole penetrating through the second interlayer insulating film 16, the third interlayer insulating film 17 and the insulation layer 28 on the power supply line 14. For example, the wiring is disposed in correspondence with the contact unit 31Gc of the luminescence pixel 20G, the wiring and the pixel electrode 31G are connected to each other by the contact unit 31Gc, and thus the electrical connection of the wiring is achieved.

The pixel electrode 31B of the luminescence pixel 20B and the pixel electrode 31R of the luminescence pixel 20R are respectively electrically connected to the corresponding source electrodes of the third transistor 23 via the contact unit 31Bc and the contact unit 31Rc as a case of the luminescence pixel 20G (see FIG. 3).

The organic EL element 30 is provided on the power supply line 14 which functions as the reflective layer. The optical resonance structure in which light with a different resonant wavelength for each of the luminescence pixels 20B, 20G, and 20R can be obtained is built on the power supply line 14. The power supply line 14 is formed to cover the surface of the third interlayer insulating film 17 over the display region E in which the luminescence pixels 20B, 20G, and 20R are provided in a plan view. The power supply line 14 is patterned except for a part in which the contact units 31Bc, 31Gc, 31Rc configured to electrically connect to the respective pixel electrodes 31B, 31G, and 31R with the corresponding third transistors 23 are provided. Accordingly, a unevenness caused by the configuration of the pixel circuit provided in a lower layer than the power supply line 14 has a structure in which it is difficult to affect the optical resonance structure provided on an upper layer than the power supply line 14.

A sealing layer 40 is formed to cover the organic EL element 30 provided on the luminescence pixels 20B, 20G, and 20R over at least the display region E. The sealing layer 40 is configured to have a first sealing film 41, a buffer layer 42, and a second sealing film 43 stacked in this order from a side of an opposite electrode 36.

The first sealing film 41 hardly transmits moisture and gas such as oxygen (gas barrier property), and is formed by using, for example, an inorganic compound such as silicon oxide, silicon nitride, silicon oxynitride, and metal oxides such as titanium oxide by which transparency can be obtained. A gas phase process capable of forming a dense film at low temperatures is preferably used as a forming method, and for example, high-density plasma deposition method such as plasma CVD or ECR plasma sputtering method, a vacuum deposition method, or ion plating method can be used. The thickness of the first sealing film 41 is approximately 200 nm to 400 nm.

On the surface of the first sealing film 41, the unevenness is created by an effect of the structure such as the organic EL element 30 provided in the lower layer. In the embodiment, the buffer layer 42 is formed to cover at least the display area E of the surface of the first sealing film 41, and to buffer and planarize the unevenness at least in the display area E in order to prevent a decrease of the sealing function of the second sealing film 43 due to unevenness, adhesion of the foreign substance or the like.

The buffer layer 42 is an organic resin layer formed by using a solution obtained by dissolving an organic resin having transparency in a solvent, and by applying and drying the solution in a printing method and a spin coating method. As the organic resin, an epoxy resin and the like can be mentioned. From the point of view that the buffer layer 42 buffers the unevenness on the surface of the first sealing film 41 and covers the foreign substance attached to the first sealing film 41 for planarizing, the thickness of the buffer layer 42 is preferably from 1 μm to 5 μm, and in the embodiment, the buffer layer 42 having the thickness of approximately 3 μm is formed using an epoxy resin. It is preferable that the buffer layer 42 be formed to cover at least the functional layer 35 in plan view and formed to cover the opposite electrode 36. By forming the buffer layer 42 so as to cover at least the functional layer 35, it is possible to buffer the unevenness at the end part of the functional layer 35. The buffer layer 42 may be formed so as to cover at least a part of the display region E side of the peripheral circuit (the data line driving circuit 101 or the pair of scanning line driving circuits 102) in addition to the display region E (see FIG. 1).

The second sealing film 43 covering the buffer layer 42 has both a transparency and gas barrier property as same as the first sealing film 41, and is formed using an inorganic compound having excellent water resistance and heat resistance. As the inorganic compound, silicon oxide, silicon nitride, silicon oxynitride, and the like are known. The second sealing film 43 may be formed by using the same method as the method of the first sealing film 41. The thickness of the second sealing film 43 is preferably formed in a range of 200 nm to 700 nm, and more preferably formed in a range of 300 nm to 400 nm such that the crack is not created during the film formation. If the buffer layer 42 is formed to cover the opposite electrode 36, the end part of the opposite electrode 36 can be covered by the first sealing film 41 and the second sealing film 43 stacked directly with the first sealing film 41.

The color filter 50 is formed on the sealing layer 40 which has a flat surface. Each of the color layers 50B, 50G, and 50R of the color filters 50 is formed by applying, exposing and developing a photosensitive resin having a pigment corresponding to each color on the sealing layer 40.

Optical Resonance Structure

Figure 5:
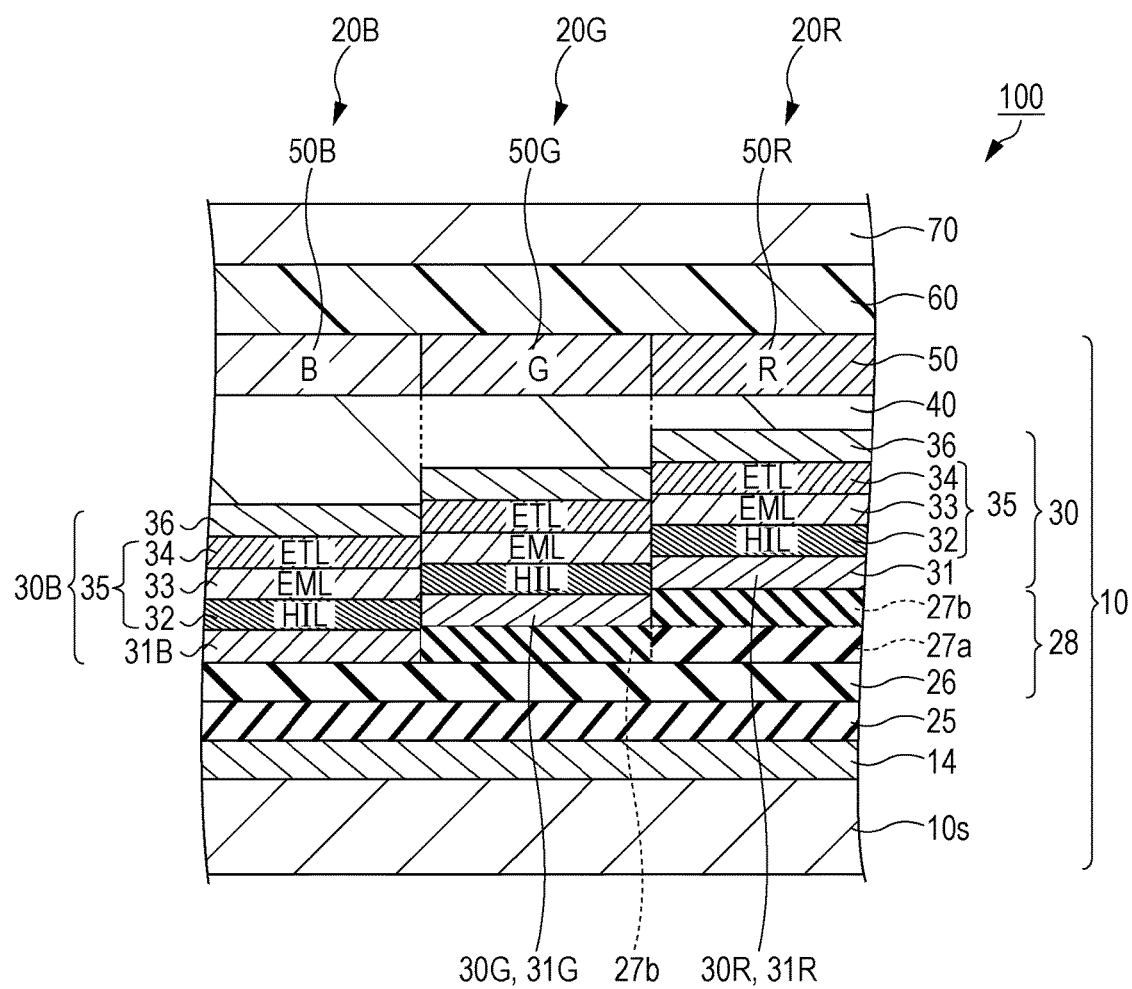
FIG. 5 is a schematic cross-sectional view illustrating a optical resonance structure in the luminescence pixel.

Next, the configuration of the optical resonance structure and the organic EL element 30 in the organic EL device 100 of the present embodiment will be described with reference to FIG. 5. FIG. 5 is a schematic cross-sectional view illustrating a optical resonance structure in the luminescence pixel.

The organic EL element 30 according to the embodiment includes the pixel electrode 31 which is a transparent anode, the opposite electrode 36 which is a semipermeable-reflective cathode, and the functional layer 35 sandwiched between the pixel electrode 31 and the opposite electrode 36. The functional layer 35 includes a hole injection layer (HIL) 32, an organic luminescence layer (EML) 33, and an electron transport layer (ETL) 34 which are stacked from the pixel electrode 31 side in order.

By applying a driving potential between the pixel electrode 31 and the opposite electrode 36, a hole is injected from the pixel electrode 31 into the functional layer 35, and an electron is injected from the opposite electrode 36 into the functional layer 35. An exciton is formed by the holes and electrons injected in the organic luminescence layer 33 included in the functional layer 35, and some of the energy are emitted as a fluorescence or phosphorescence when the exciton is disappeared (when the electrons and holes are recombined).

The functional layer 35 may have, for example, a hole transport layer or an electron injection layer or an interlayer which improves or controls the injection property and transport property of the holes or the electrons for the organic luminescence layer 33 in addition to the hole injection layer 32, the organic luminescence layer 33 and the electron transport layer 34.

This embodiment has a configuration in which white light is obtained from the organic luminescence layer 33 of the functional layer 35. Thus, the functional layer 35 is formed in the luminescence pixels 20B, 20G, and 20R in common. White light is realized by combining the organic luminescence layers in which blue (B) luminescence, green (G) luminescence, and red (R) luminescence is obtained. Also, pseudo white light can be obtained by combining the organic luminescence layers in which luminescence of blue (B) and yellow (Y) is obtained.

This embodiment has a configuration in which a desired luminescence color for each of the luminescence pixels 20B, 20G, and 20R is obtained by white light created from the organic EL element 30 being transmitted through the color filter 50. The optical resonance structure is built between the power supply line 14 and the opposite electrode 36 which function as the reflective layer in each of the luminescence pixels 20B, 20G, and 20R, so luminance emphasized with the resonant wavelength corresponding to the each luminescence color of B, G, and R is obtained.

The resonant wavelength of each of the luminescence pixels 20B, 20G, and 20R is determined by an optical distance D (also referred to as an optical path length) between the power supply line 14 and the opposite electrode 36 as the reflective layer, and specifically, the resonant wavelength is set so as to satisfy Expression (1) below.

$$D = \{(2\pi m + \phi L + \phi U)/4\pi\}\lambda \tag{1}$$

m is a positive integer (m=0, 1, 2 . . . ), $\phi L$ is a phase shift in the reflection on the reflective layer, $\phi U$ is a phase shift in the reflection on the opposite electrode 36, and λ is a peak wavelength of a standing wave.

The optical distance D in the optical resonance structure of the luminescence pixels 20B, 20G, and 20R becomes larger in the order of B, G, and R, and is adjusted by varying the configuration of a plurality of insulation layers disposed between the power supply line 14 (the reflective layer) and the pixel electrode 31. Specifically a first insulation layer 25 and the second insulation layer 26 are provided between the power supply line 14 and the pixel electrode 31B, a fourth insulation layer 27b is provided in addition to the first insulation layer 25 and the second insulation layer 26 between the power supply line 14 and the pixel electrode 31G, the first insulation layer 25, the second insulation layer 26, a third insulation layer 27a, and the fourth insulation layer 27b are provided between the power supply line 14 and the pixel electrode 31R, so the optical distances D are different from each other in each of the luminescence pixels 20B, 20G, and 20R. The optical distance of each layer in the optical resonance structure can be represented by multiplying the thickness (t) and the refractive index (n) of each layer through which light is transmitted.

For example, a peak wavelength (resonant wavelength) of luminance in the luminescence pixel 20B is set to 470 nm. Likewise, the peak wavelength (resonant wavelength) of luminance in the luminescence pixel 20G is set to 540 nm, and the peak wavelength (resonant wavelength) of luminance in the luminescence pixel 20R is set to 610 nm.

For example, the thickness of the pixel electrodes 31B, 31G, and 31R made of a transparent conductive film such as ITO is approximately 20 nm, the refractive index is 1.8, and the thickness of the functional layer 35 is approximately 110 nm, and the refractive index is 1.8 to achieve the peak wavelength above. In the Expression (1), if the thickness of each of the insulation layers between the power supply line 14 (reflective layer) and the opposite electrode 36 is calculated when m is 1, the thickness of the first insulation layer 25 made of $SiO_2$ whose refractive index is 1.46 becomes 35 nm and the thickness of the second insulation layer 26 made of SiN whose refractive index is 1.8 becomes 45 nm, and the total thickness becomes 80 nm in the luminescence pixel 20B. In the luminescence pixel 20G, the thickness of the fourth insulation layer 27b made of $SiO_2$ whose refractive index is 1.46 becomes 44 nm, and the total thickness of the thickness of the first insulation layer 25 added to the thickness of the second insulation layer 26 becomes 124 nm. In the luminescence pixel 20R, the thickness of the third insulation layer 27a and the fourth insulation layer 27b made of $SiO_2$ becomes 100 nm, and the total thickness of the thickness of the first insulation layer 25 added to the thickness of the second insulation layer 26 becomes 180 nm.

In the embodiment, the first insulation layer 25 covering the power supply line 14 which functions as the reflective layer is provided in the luminescence pixels 20B, 20G, and 20R in common, is formed by using $SiO_2$ as described above, and functions as a reflection-increasing layer which improves photoreflectance in the invention. Therefore, the insulation layer 28 including the second insulation layer 26, the third insulation layer 27a, and the fourth insulation layer 27b provided to substantially change the optical distance D of the optical resonance structure in each of the luminescence pixels 20B, 20G, and 20R, functions as the optical path length adjustment layer in the invention. Thereafter, the insulation layer 28 will be referred to as the optical path length adjustment layer 28 by using a sign of the insulation layer 28.

In the optical resonance structure of each of the luminescence pixels 20B, 20G, and 20R, the optical distance D of the optical resonance structure is set in accordance with the thickness and the refractive index of each of the first insulation layer 25, the second insulation layer 26, the third insulation layer 27a, and the fourth insulation layer 27b, the thickness and the refractive index of each of the pixel electrode 31 and the functional layer 35, and an extinction coefficient of the power supply line 14 and the opposite electrode 36 as the reflective layer in order to realize high accuracy of the peak wavelength. The refractive index of the layer through which light is transmitted strictly depends on the wavelength of the transmitted light.

In the optical resonance structure of the embodiment, the optical path length adjustment layer 28 is configured to have the layer (third insulation layer 27a and fourth insulation layer 27b) whose refractive index is smaller than the refractive index of the adjacent layer (second insulation layer 26) so that the reflection of light can be occurred not only at an interface between the reflective layer 14 and the first insulation layer 25 but also at interfaces between the second insulation layer 26 and the third insulation layer 27a and between the second insulation layer 26 and the fourth insulation layer 27b. Accordingly, in the luminescence pixel 20G, if compared with a case where the reflection at the interface between the second insulation layer 26 and the fourth insulation layer 27b does not occur, that is, a case where the same material constitutes the second insulation layer 26 and the fourth insulation layer 27b, an intensity of light obtained from the luminescence pixel 20G (luminance) decreases. Similarly, in the luminescence pixel 20R, if compared with a case where the reflection at the interface between the second insulation layer 26 and the third insulation layer 27a does not occur, that is, a case where the same material constitutes the second insulation layer 26 and the third insulation layer 27a, an intensity of light (luminance) obtained from the luminescence pixel 20R decreases. In the luminescence pixel 20G, the fourth insulation layer 27b functions as the luminance adjustment layer of the invention among the optical path length adjustment layers 28, and in the luminescence pixel 20R, the third insulation layer 27a functions as the luminance adjustment layer of the invention among the optical path length adjustment layers 28. From the point of view that in the luminescence pixel 20R, the third insulation layer 27a and the fourth insulation layer 27b are formed by using $SiO_2$, the third insulation layer 27a and the fourth insulation layer 27b may function as the luminance adjustment layer.

Manufacture Method of Electro-Optical Device

Figure 6:
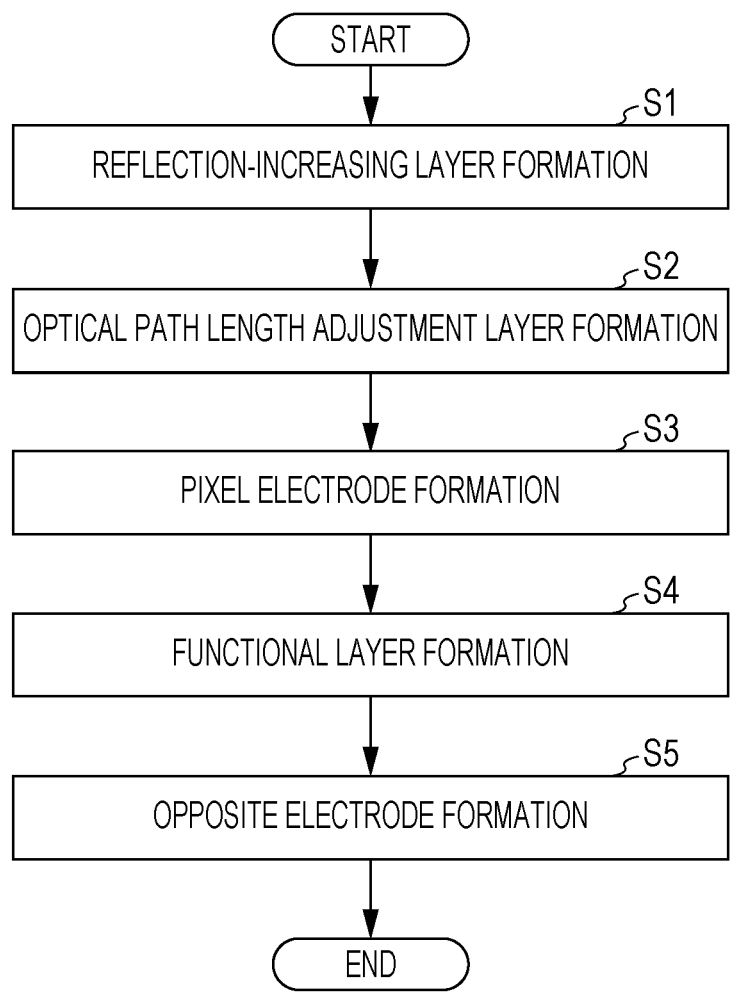
FIG. 6 is a flow chart illustrating a manufacture method of the organic EL device according to the first embodiment.

Next, a manufacture method of the organic EL device 100 as the electro-optical device will be described with reference to FIGS. 6 to 12. FIG. 6 is a flow chart illustrating a manufacture method of the organic EL device, and FIGS. 7 to 12 are schematic cross-sectional views illustrating a manufacture method of the organic EL device. A feature part of the invention is mainly in a forming step of the optical path length adjustment layer 28 in the element substrate 10. Hereinafter, the feature part of the manufacture method of the element substrate 10 in the manufacture method of the organic EL device 100 will be described.

As shown in FIG. 6, the manufacture method of the element substrate 10 according to the embodiment includes at least a reflection-increasing layer forming step (STEP S1), an optical path length adjustment layer forming step (STEP S2), a pixel electrode forming step (STEP S3), a functional layer forming step (STEP S4), a opposite electrode forming step (STEP S5). Any known method as described above can be used as the method in which the wiring connected to the pixel circuit and the pixel circuit is formed on a base material 10s of the element substrate 10 is formed, and the method in which the power supply line 14 is formed as the reflective layer. In the following description, the reflective layer will be described as the reflective layer 14 by using a sign of the power supply line 14.

Figure 7:
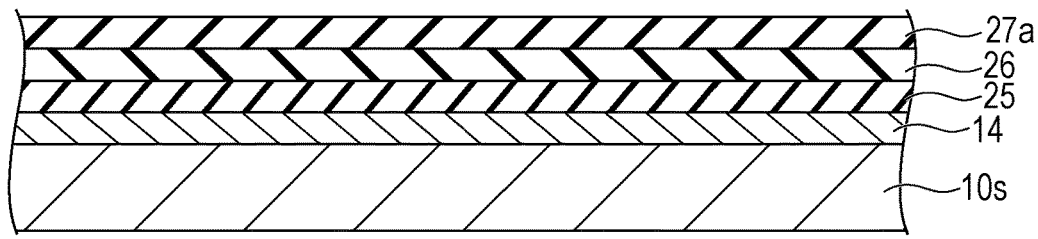
FIG. 7 is a schematic cross-sectional view illustrating a manufacture method of the organic EL device according to the first embodiment.

As shown in FIG. 7, in the reflection-increasing layer forming step of STEP S1 and the optical path length adjustment layer forming step of STEP S2, the first insulation layer 25, the second insulation layer 26, and the third insulation layer 27a are formed to be deposited in this order on the reflective layer 14. The first insulation layer 25 and the third insulation layer 27a are formed by a deposition of $SiO_2$ by a CVD method, for example. The second insulation layer 26 is formed by a deposition of SiN by the same CVD method, for example. As an aim of the thickness of each of the insulation layers, the thickness of the first insulation layer 25 which functions as the reflection-increasing layer is, for example, 35 nm, the thickness of the second insulation layer 26 is, for example, 45 nm, and the thickness of the third insulation layer 27a which functions as the luminance adjustment layer is, for example, 56 nm.

Figure 8:
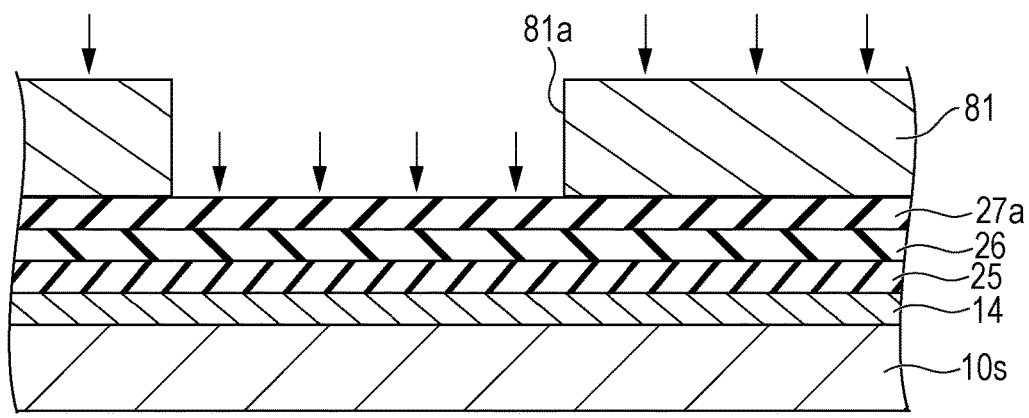
FIG. 8 is a schematic cross-sectional view illustrating a manufacture method of the organic EL device according to the first embodiment.
Figure 9:
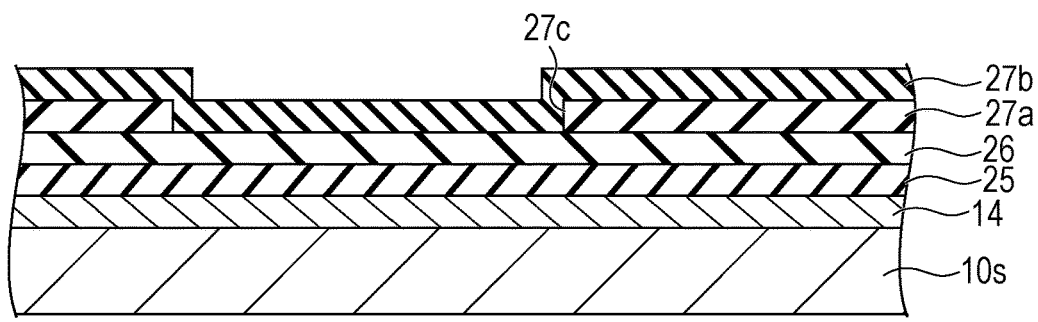
FIG. 9 is a schematic cross-sectional view illustrating a manufacture method of the organic EL device according to the first embodiment.

As shown in FIG. 8, a photosensitive resistance layer is formed to cover the third insulation layer 27a, a resistance pattern 81 having an opening unit 81a is formed by exposure and development. The opening unit 81a is formed over the adjacent luminescence pixel 20B and the luminescence pixel 20G. As shown in FIG. 9, the opening unit 27c is formed on the third insulation layer 27a by dry etching of the third insulation layer 27a using fluorine-based raw gas through the resistance pattern 81. After the dry etching, the resistance pattern 81 is removed. As shown in FIG. 3, the opening unit 27c is formed over the adjacent luminescence pixel 20B and the luminescence pixel 20G in a region except for the contact units 31Bc and 31Gc of the luminescence pixel 20B and the luminescence pixel 20G.

Figure 10:
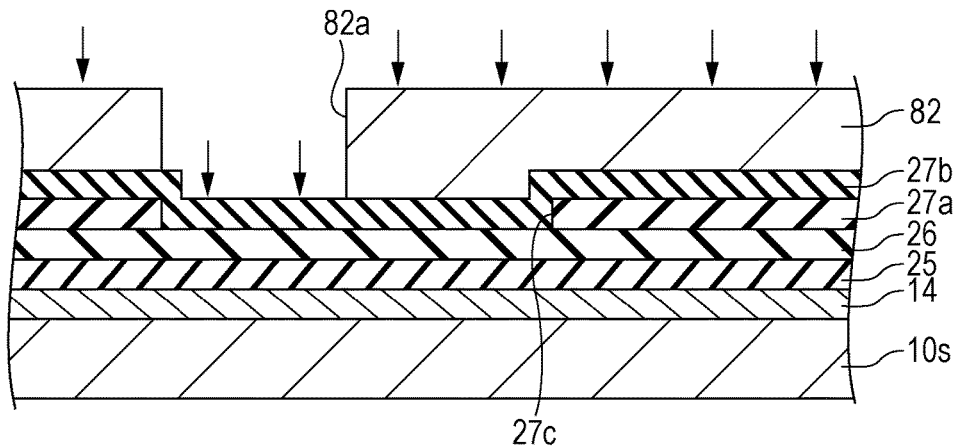
FIG. 10 is a schematic cross-sectional view illustrating a manufacture method of the organic EL device according to the first embodiment.
Figure 11:
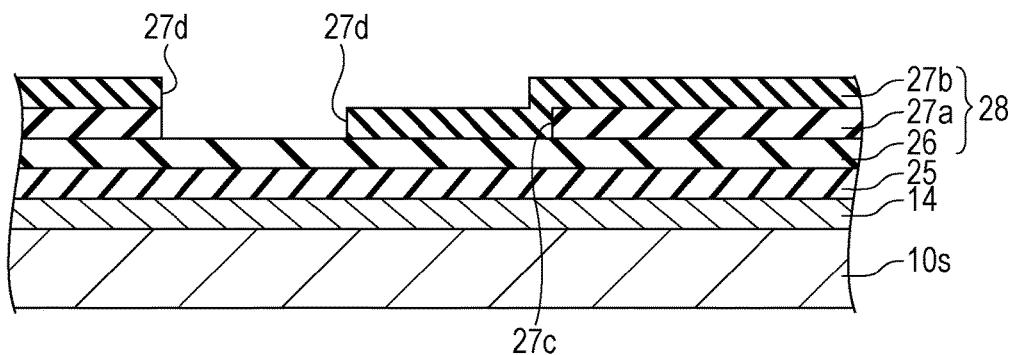
FIG. 11 is a schematic cross-sectional view illustrating a manufacture method of the organic EL device according to the first embodiment.

Subsequently, as shown in FIG. 10, the fourth insulation layer 27b is formed to cover the third insulation layer 27a and the opening unit 27c of the third insulation layer 27a. The fourth insulation layer 27b is formed by the deposition of $SiO_2$ by a CVD method, for example, as well. The photosensitive resistance layer is formed to cover the fourth insulation layer 27b, a resistance pattern 82 having an opening unit 82a is formed by exposure and development. The opening unit 82a is formed to face the luminescence pixel 20B. As shown in FIG. 11, the opening unit 27d is formed on the fourth insulation layer 27b by dry etching of the fourth insulation layer 27b exposed in the opening unit 82a, for example, using fluorine-based raw gas through the resistance pattern 82. Since an etching rate in a dry etching of the second insulation layer 26 made of SiN as compared to the layer made of $SiO_2$ is delayed, the second insulation layer 26 can function as an etching stop film in dry etching. After the dry etching, the resistance pattern 82 is removed. As shown in FIG. 3, the opening unit 27d is formed inside of the opening unit 27c which is formed over the adjacent luminescence pixel 20B and the luminescence pixel 20G, and formed to face an inside of the luminescence pixel 20B. Then, the complete optical path length adjustment layer 28 having the optical distance different from each other in the luminescence pixels 20B, 20G, and 20R is provided. The process proceeds to STEP S3.

Figure 12:
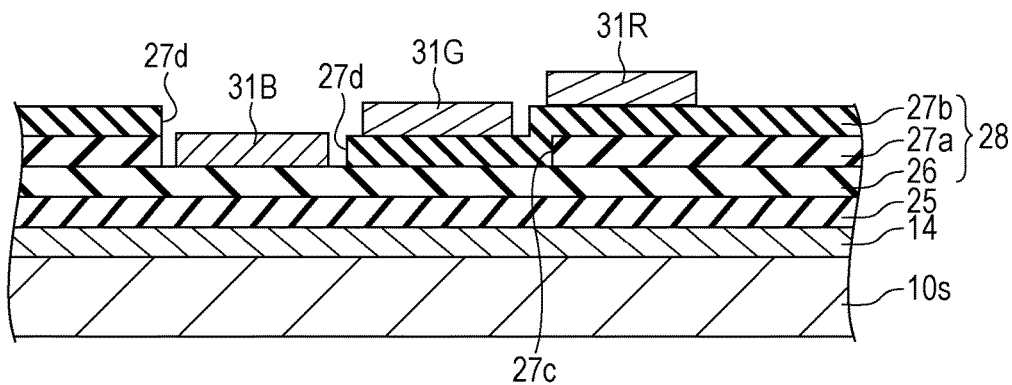
FIG. 12 is a schematic cross-sectional view illustrating a manufacture method of the organic EL device according to the first embodiment.

In the pixel electrode forming step of STEP S3, the transparent conductive film such as ITO is deposited to cover the optical path length adjustment layer 28, and by pattening the transparent conductive film the pixel electrode 31B is formed on the second insulation layer 26 inside of the opening unit 27d, the pixel electrode 31G is formed on the fourth insulation layer 27b inside of the opening unit 27c, and the pixel electrode 31R is formed on the fourth insulation layer 27b, as shown in FIG. 12. The aim of the thickness of the transparent conductive film is, for example, approximately 20 nm. The process proceeds to STEP S4.

In the functional layer forming step of STEP S4, the functional layer 35 is respectively formed on the pixel electrodes 31B, 31G, and 31R in the luminescence pixels 20B, 20G, 20R. In this embodiment, as described above, the functional layer 35 is configured to have the hole injection layer 32, the organic luminescence layer 33, and the electron transport layer 34. Thus, these layers are formed over the luminescence pixels 20B, 20G, 20R in common. A configuration and a forming method of each layer of the functional layer 35 are not limited in particular, and, for example, any known methods such as a dry deposition method such as an evaporation method or a wet deposition method such as spin coating are used. A combination with the dry deposition method and the wet deposition method may also be used according to a material used for the functional layer formation. In this embodiment, the hole injection layer 32, the organic luminescence layer 33, and the electron transport layer 34 are formed by using the evaporation method. As an aim of the thickness of each of the insulation layers in the functional layer 35, the thickness of the hole injection layer 32 is, for example, 30 nm, the thickness of the organic luminescence layer 33 is, for example, 55 nm, and the thickness of the electron transport layer 34 is, for example, 25 nm. So, the aim of the thickness of the functional layer 35 is 110 nm which is a total value of the aims of the thicknesses of the layers in the functional layer 35. The process proceeds to STEP S5.

In the opposite electrode forming step of STEP S5, the opposite electrode 36 is formed to cover the functional layer 35 formed in STEP S4 over the luminescence pixels 20B, 20G, and 20R. In the embodiment, the opposite electrode 36 is formed to have a thin film of a MgAg having a thickness of approximately 20 nm alloy by co-evaporation of Mg and Ag.

Thereafter, the element substrate 10 formation is completed through the step in which the sealing layer 40 covering the opposite electrode 36 is formed and the step in which the color filter 50 is formed on the sealing layer 40. The organic EL device 100 formation is completed through the step of bonding the element substrate 10 and the sealing substrate 70 via the resin layer 60 (see FIG. 4 or 5).

According to the first embodiment, the following effects can be obtained. (1) The optical path length adjustment layer 28 in the optical resonance structure of the luminescence pixel 20G includes the fourth insulation layer 27b which functions as the luminance adjustment layer. Similarly, the optical path length adjustment layer 28 in the optical resonance structure of the luminescence pixel 20R includes the third insulation layer 27a (or the third insulation layer 27a and the fourth insulation layer 27b) which functions as the luminance adjustment layer. For example, in a case where it is need to increase the magnitude of the current flowing through the organic EL element 30B of the luminescence pixel 20B than the magnitude of the current flowing through the organic EL elements 30G and 30R of the luminescence pixels 20G and 20R when white color is displayed, current consumptions become different and current ratios become different between the luminescence pixels 20B, 20G, and 20R. The optical path length adjustment layer 28 of the luminescence pixels 20G and 20R includes the luminance adjustment layer and thus, when white color is displayed, the magnitude of the current flowing through the organic EL elements 30G and 30R of the luminescence pixels 20G and 20R increases. Therefore, the difference between the magnitudes of the current flowing through the organic EL elements 30B, 30G, and 30R in the luminescence pixels 20B, 20G, and 20R can be reduced or the current ratio can be uniform.

(2) The third insulation layer 27a (the fourth insulation layer 27b) which functions as the luminance adjustment layer is provided between the reflective layer 14 and the pixel electrode 31. Therefore, the difference between the magnitudes of the current flowing through the organic EL elements 30B, 30G, and 30R in the luminescence pixels 20B, 20G, and 20R can be reduced or the current ratio can become uniform without affecting a luminescent property of the functional layer 35 provided on the pixel electrode 31.

(3) The third insulation layer 27a (the fourth insulation layer 27b) which functions as the luminance adjustment layer made of $SiO_2$ is stacked in contact with the second insulation layer 26 made of SiN having the refractive index greater than the refractive index of $SiO_2$. Accordingly, the reflection of light occurs at the interface between the second insulation layer 26 and the third insulation layer 27a (the fourth insulation layer 27b) and the luminescence luminance in the luminescence pixels 20G and 20R is adjusted. Since the third insulation layer 27a (the fourth insulation layer 27b) which functions as the luminance adjustment layer is formed by using a $SiO_2$ film having optical transparency, the luminescence luminance can be adjusted with high accuracy.

Second Embodiment

Another Electro-Optical Device

Figure 13:
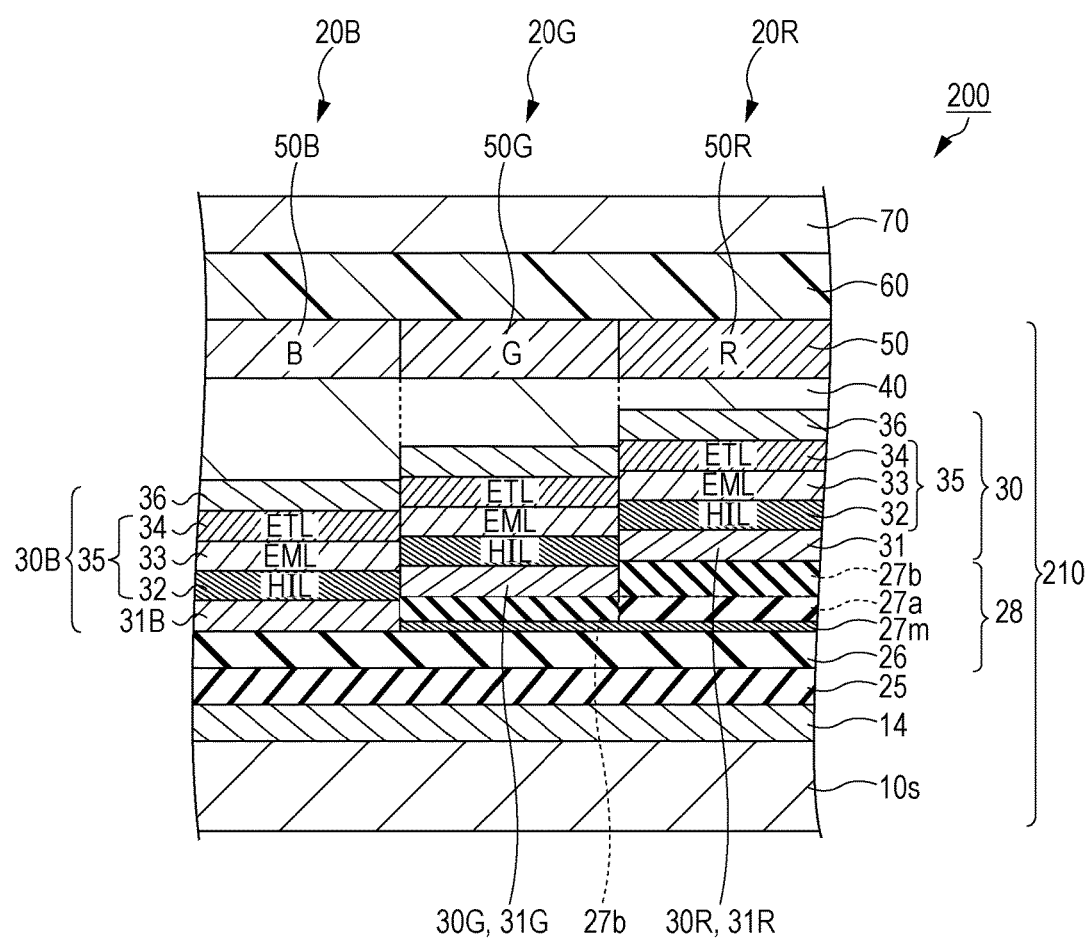
FIG. 13 is a schematic cross-sectional view illustrating an optical resonance structure in an organic EL device according to a second embodiment.

Next, an example of the same organic EL device as another electro-optical device having an optical resonance structure of a second embodiment will be described with reference to FIG. 13. FIG. 13 is a schematic cross-sectional view illustrating the optical resonance structure in the organic EL device according to the second embodiment. The organic EL device of the second embodiment is obtained by varying the shape of the luminance adjustment layer in the optical resonance structures according to the organic EL device 100 of the first embodiment. Therefore, the same reference numerals will be given to the same configuration as the organic EL device 100, and a detailed description will be omitted.

As shown in FIG. 13, the organic EL device 200 as the electro-optical device of this embodiment includes the element substrate 210 configured to have the luminescence pixels 20B, 20G, and 20R in which the luminescence of different colors is obtained and the transparent sealing substrate 70 disposed opposite to the element substrate 210 via the resin layer 60. The element substrate 210 includes the reflective layer 14 and the first insulation layer 25 formed in common over the luminescence pixels 20B, 20G, and 20R, the optical path length adjustment layer 28 provided corresponding to each of the luminescence pixels 20B, 20G, and 20R, the organic EL elements 30B, 30G, and 30R and the color filter 50 (filter layers 50B, 50G, and 50R) on the base material 10s. The filter layers 50B, 50G, and 50R are respectively disposed on the sealing layer 40 covering each of the organic EL elements 30B, 30G, and 30R.

Each of the organic EL elements 30B, 30G, and 30R includes the functional layer 35 sandwiched between the pixel electrode 31 which is an anode and the opposite electrode 36 which is a cathode. The functional layer 35 includes the hole injection layer 32 stacked from the pixel electrode 31 side in order, the organic luminescence layer 33, and the electron transport layer 34, and white light is emitted from the functional layer 35. White light is transmitted through the filter layers 50B, 50G, and 50R, converted to the desired color light, and obtained from the sealing substrate 70 side.

The optical resonance structure in the organic EL device 200 includes the first insulation layer 25 and the second insulation layer 26 between the reflective layer 14 and the pixel electrode 31B in the luminescence pixel 20B. The metal layer 27m and the fourth insulation layer 27b, in addition to the first insulation layer 25 and the second insulation layer 26, are provided between the reflective layer 14 and the pixel electrode 31G in the luminescence pixel 20G. The metal layer 27m, the third insulation layer 27a, and the fourth insulation layer 27b, in addition to the first insulation layer 25 and the second insulation layer 26, are provided in the luminescence pixel 20R.

The optical path length adjustment layer 28 of the embodiment includes the metal layer 27m in addition to the second insulation layer 26, the third insulation layer 27a, and the fourth insulation layer 27b (layer having the refractive index smaller than that of the second insulation layer 26). The metal layer 27m is made of, for example, at least one metal selected from among Ti, Mo, Ta, Al, Cu, and Cr, or an alloy of these metals, and is formed to have light transmission property and photoreflectance, for example, as a metal thin film using a sputtering method.

In the optical resonance structure, by changing a layer structure between the reflective layer 14 and the pixel electrode 31 in the luminescence pixels 20B, 20G, and 20R, light with the resonant wavelength (peak wavelength) of 470 nm is obtained from the luminescence pixel 20B, light with the resonant wavelength (peak wavelength) of 570 nm is obtained from the luminescence pixel 20G, and light with the resonant wavelength (peak wavelength) of 610 nm is obtained from the luminescence pixel 20R. Thus, a adjustment of the luminance is performed in the luminescence pixels 20G and 20R in which the metal layer 27m is provided. In a case where light with above resonant wavelength (peak wavelength) is obtained, for example, the aim of the thickness of the first insulation layer 25 formed of $SiO_2$ is 35 nm, the aim of the thickness of the second insulation layer 26 formed of SiN is 45 nm, the aim of the thickness of the metal layer 27m formed of TiN is 2 nm, the aims of the thicknesses of the third insulation layer 27a and the fourth insulation layer 27b formed of $SiO_2$ are respectively 56 nm and 44 nm, and the aims of the thicknesses of the pixel electrodes 31B, 31G, and 31R formed of ITO are 20 nm.

Figure 14:
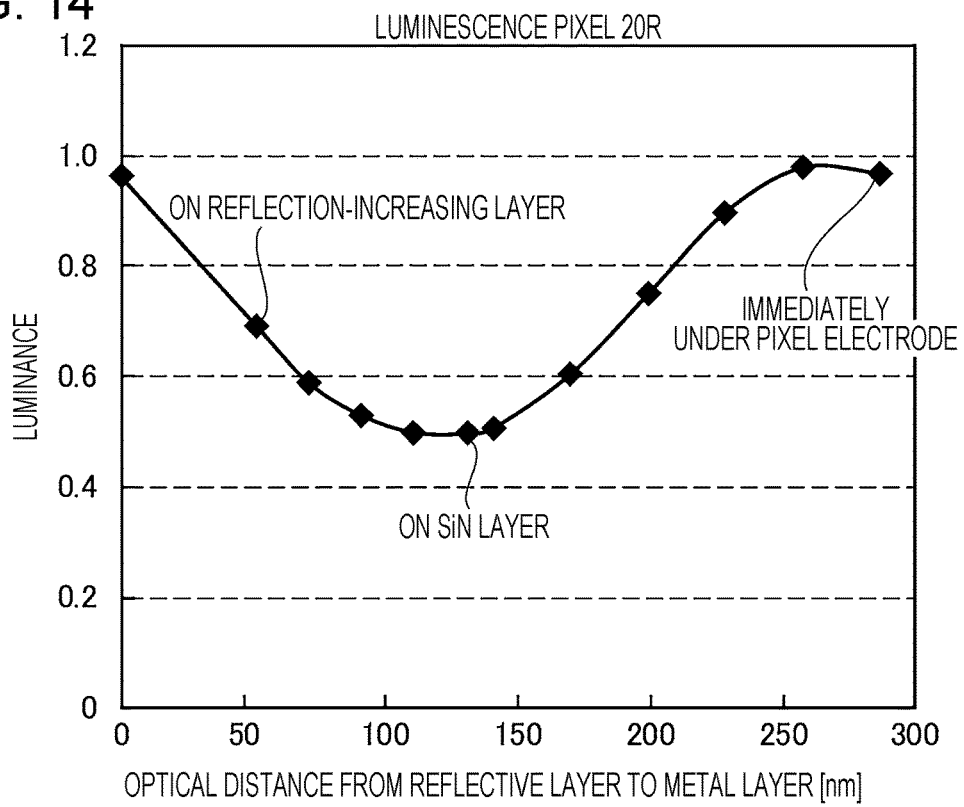
FIG. 14 is a graph illustrating a relationship between an optical distance from a reflective layer to a metal layer and a luminance in the luminescence pixel in which red light is obtained.
Figure 15:
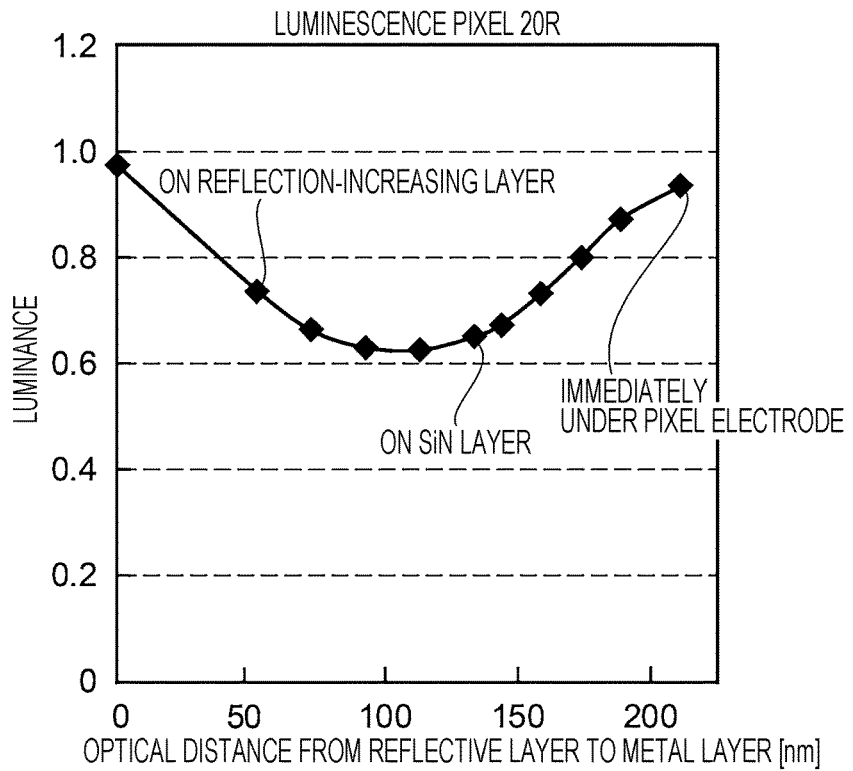
FIG. 15 is a graph illustrating a relationship between an optical distance and a luminance from a reflective layer to a metal layer in the luminescence pixel in which green light is obtained.

Next, a relationship between a position of the metal layer 27m and the luminescence luminance (thereafter, simply referred to as "luminance") will be described with reference to FIGS. 14 and 15. The metal layer 27m is provided between the reflective layer 14 and pixel electrodes 31G and 31R. FIG. 14 is a graph illustrating a relationship between the optical distance from the reflective layer to the metal layer and a luminance in the luminescence pixel in which red light is obtained, FIG. 15 is a graph illustrating a relationship between the optical distance and the luminance from the reflective layer to the metal layer in the luminescence pixel in which green light is obtained. FIGS. 14 and 15 are graphs obtained by an optical simulation, and the luminance is obtained by digitizing the case where there is no metal layer 27m as "1".

Although the details will be described below, in the organic EL device 200 of this embodiment, the metal layer 27m made of TiN is provided on the second insulation layer 26 made of SiN in the luminescence pixel 20G and the luminescence pixel 20R so that an adjustment width of the luminance is increased in the luminescence pixel 20R having the longest resonant wavelength (peak wavelength) (see FIG. 13).

As shown in FIG. 14, in the luminescence pixel 20R, in a case where the metal layer 27m is provided on the first insulation layer 25 which functions as the reflection-increasing layer, the optical distance from the reflective layer 14 to the metal layer 27m is approximately 52 nm. At this time, the luminance is approximately 0.7 (70%) as compared with the case where the metal layer 27m is not provided. In a case where the metal layer 27m is provided on the second insulation layer 26, the optical distance from the reflective layer 14 to the metal layer 27m is approximately 141 nm. At this time, the luminance is approximately 0.5 (50%) as compared with the case where the metal layer 27m is not provided. Similarly, in a case where the metal layer 27m is provided immediately under the pixel electrode 31, the optical distance from the reflective layer 14 to the metal layer 27m is approximately 287 nm. At this time, the luminance is approximately 0.97 (97%) as compared with the case where the metal layer 27m is not provided.

As shown in FIG. 15, in the luminescence pixel 20G, in a case where the metal layer 27m is provided on the first insulation layer 25 which functions as the reflection-increasing layer, the optical distance from the reflective layer 14 to the metal layer 27m is approximately 52 nm, the luminance is approximately 0.74 (74%) as compared with the case where the metal layer 27m is not provided. As mentioned above, in a case where the metal layer 27m is provided on the second insulation layer 26, the optical distance from the reflective layer 14 to the metal layer 27m is approximately 141 nm, the luminance is approximately 0.67 (67%) as compared with the case where the metal layer 27m is not provided. Similarly, in a case where the metal layer 27m is provided immediately under the pixel electrode 31, the optical distance from the reflective layer 14 to the metal layer 27m is approximately 206 nm, the luminance is approximately 0.94 (94%) as compared with the case where the metal layer 27m is not provided. In the organic EL device 200 of the embodiment, in a case where the metal layer 27m is further provided as the luminance adjustment layer, the luminance of the luminescence pixel 20R is reduced by approximately 50% and the luminance of the luminescence pixel 20G is reduced by approximately 33% as compared with the case where the metal layer 27m is not provided as the luminance adjustment layer.

In the optical resonance structure of the organic EL device 200, when the optical distance from the metal layer 27m to the opposite electrode 36 is D1, the optical distance from the reflective layer 14 to the metal layer 27m is D2, and D1 and D2 satisfy the condition of the Expression (2) below, it is considered that a phase shift between light reflected by the opposite electrode 36 and light reflected by the reflective layer 14 is λ/2 and a peak luminance is decreased.

$$(m+\tfrac{1}{2})\lambda = 2D - \phi \quad (2)$$

m is the positive integer (m=0, 1, 2 . . . ), λ is the resonant wavelength, D is the optical distance in the optical resonance structure, and in the case of D1, φ is a total value of the phase shift in the interface between the opposite electrode 36 and the functional layer 35 and the phase shift in the interface between the metal layer 27m and the layer adjacent to the metal layer 27m. Also, in the case of D2, φ is a total value of the phase shift in the interface between the reflective layer 14 and the first insulation layer 25 and the phase shift in the interface between the metal layer 27m and the layer adjacent to the metal layer 27m.

That is, the position of the metal layer 27m between the reflective layer 14 and the pixel electrode 31 is set by how much the luminance in the luminescence pixel 20 is reduced as compared with the case where the metal layer 27m is not provided.

According to the organic EL device 200 of the second embodiment, the following effects can be obtained. (1) The optical path length adjustment layer 28 in the optical resonance structure of the luminescence pixel 20G includes the fourth insulation layer 27b and the metal layer 27m which function as the luminance adjustment layer. The optical path length adjustment layer 28 in the optical resonance structure of the luminescence pixel 20R includes the third insulation layer 27a and the metal layer 27m which function as the luminance adjustment layer. The luminance can be decreased more effectively as compared with the case where the metal layer 27m is not provided. That is, the difference between the magnitudes of the current flowing through the organic EL elements 30B, 30G, and 30R in the luminescence pixels 20B, 20G, and 20R can be reduced more effectively or the current ratio can be uniform more effectively when white color is displayed.

(2) The metal layer 27m is made of at least one metal selected from among Ti, Mo, Ta, Al, Cu, and Cr, or an alloy of these metals, and thus can be configured to have light transmission property and photoreflectance as the metal thin film using the metals or the alloy, and can have a function of the luminance adjustment. Particularly, since the metal layer 27m can have a low reflexibility by using a metal nitride (TiN) in the embodiment, the luminance can be adjusted slowly without being in a state of a rapid decrease of the luminance.

Further, since special metal materials are not used, the metal layer 27m can be formed using various materials and devices for forming a wiring structure of the element substrate 10.

In the first embodiment and the second embodiment, the luminescence pixels 20G and 20R correspond to the first pixel of the invention, the luminescence pixel 20B corresponds to the second pixel of the invention.

Figure 16:
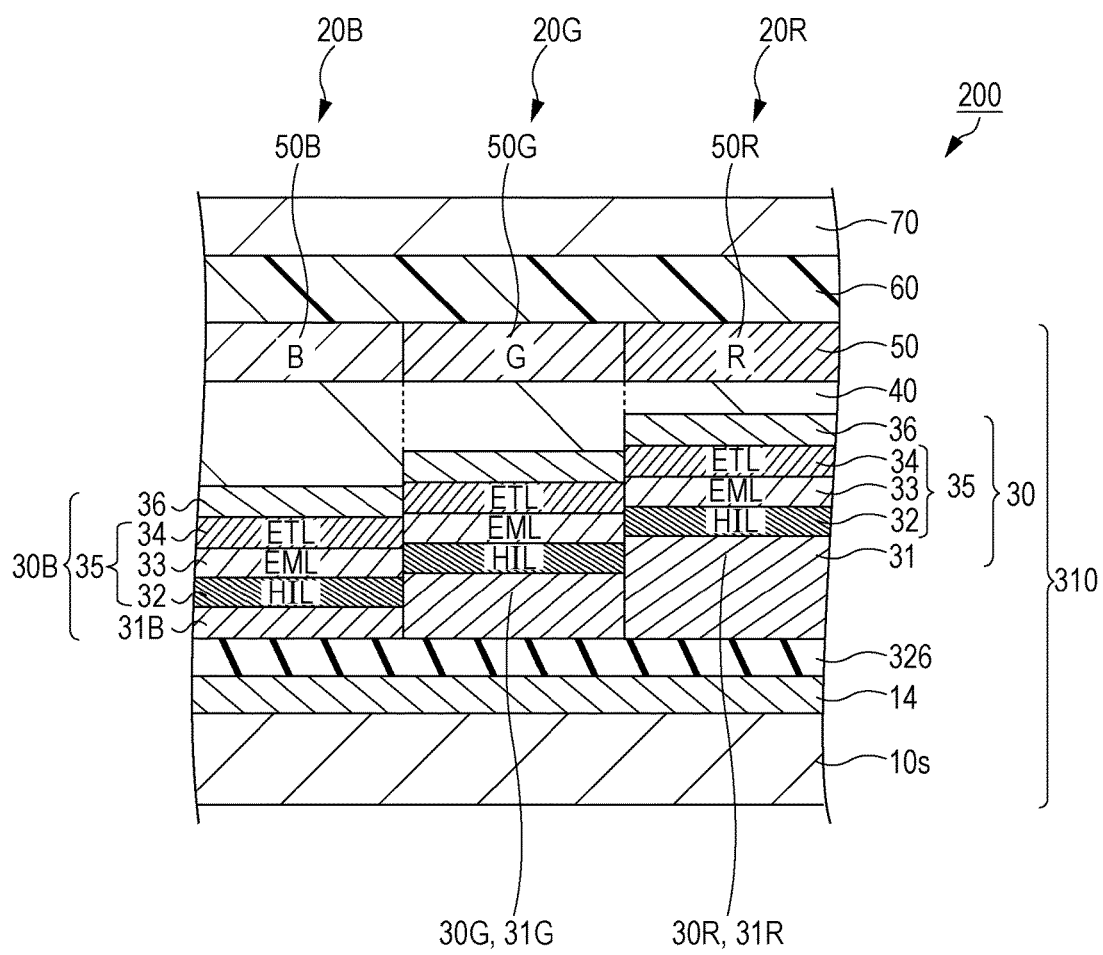
FIG. 16 is a schematic cross-sectional view illustrating an optical resonance structure of an organic EL device according to Comparative Example 1.

Next, the effect of the optical resonance structure including the luminance adjustment layer will be described more specifically by comparison between examples and comparative examples. FIG. 16 is a schematic cross-sectional view illustrating an optical resonance structure of the organic EL device according to Comparative Example 1.

COMPARATIVE EXAMPLE 1

As shown in FIG. 16, a organic EL device 300 of Comparative Example 1 includes an element substrate 310 configured to have the luminescence pixels 20B, 20G, and 20R in which the luminescence of different colors is obtained and the transparent sealing substrate 70 disposed opposite to the element substrate 310 via the resin layer 60. The element substrate 310 includes the reflective layer 14 and an insulation layer 326 formed in common over the luminescence pixels 20B, 20G, and 20R, the organic EL elements 30B, 30G, and 30R and the color filter 50 (filter layers 50B, 50G, and 50R) which are disposed in correspondence with each of the luminescence pixels 20B, 20G, and 20R on the base material 10s. The filter layers 50B, 50G, and 50R are respectively disposed on the sealing layer 40 covering each of the organic EL elements 30B, 30G, and 30R.

Each of the organic EL elements 30B, 30G, and 30R includes the functional layer 35 sandwiched between the pixel electrode 31 which is an anode and the opposite electrode 36 which is a cathode. The functional layer 35 includes the hole injection layer 32 stacked from the pixel electrode 31 side in order, the organic luminescence layer 33, and the electron transport layer 34, and white light is emitted from the functional layer 35. White light is transmitted through the filter layers 50B, 50G, and 50R, converted to the desired color light, and obtained from the sealing substrate 70 side.

In the optical resonance structure in the organic EL device 300 of Comparative Example 1, light with the resonant wavelength (peak wavelength) is obtained by varying respectively the thicknesses of the pixel electrodes 31B, 31G, and 31R of the luminescence pixels 20B, 20G, and 20R. The insulation layer 326 between the reflective layer 14 and the pixel electrode 31 can be formed by using SiN or $SiO_2$. In the case where light with the same resonant wavelength as that of the organic EL device 100 of this embodiment is obtained, for example, the aim of thickness of the insulation layer 326 is 73 nm in a case where the insulation layer 326 is formed by using SiN, and the aim of the pixel electrode 31B is 20 nm, the aim of thickness of the pixel electrode 31G is 57 nm, and the aim of thickness of the pixel electrode 31R is 112 nm in a case where the insulation layer 326 is formed by using ITO. That is, the optical resonance structure of Comparative Example 1 does not include the luminance adjustment layer.

EXAMPLE 1

An optical resonance structure having the luminance adjustment layer of Example 1 is the optical resonance structure described for the organic EL device 100 of the first embodiment, the aim of the thickness of the first insulation layer 25 formed of $SiO_2$ is 35 nm, the aim of the thickness of the second insulation layer 26 formed of SiN is 45 nm, the aims of the thickness of the third insulation layer 27a and the fourth insulation layer 27b formed of $SiO_2$ are respectively 56 nm and 44 nm, and the aims of the thicknesses of the pixel electrodes 31B, 31G, and 31R formed of ITO are 20 nm.

EXAMPLE 2

An optical resonance structure having the luminance adjustment layer of Example 2 is the optical resonance structure described for the organic EL device 200 of the second embodiment, the aim of the thickness of the first insulation layer 25 formed of $SiO_2$ is 35 nm, the aim of the thickness of the second insulation layer 26 formed of SiN is 45 nm, the aim of the thickness of the metal layer 27m formed of TiN is 2 nm, the aim of the thickness of the third insulation layer 27a and the fourth insulation layer 27b formed of $SiO_2$ are respectively 56 nm and 44 nm, and the aim of the thicknesses of the pixel electrodes 31B, 31G, and 31R formed of ITO are 20 nm.

The configurations of the functional layers 35 between the pixel electrodes 31B, 31G, and 31R and the opposite electrodes 36 are same in Comparative Example 1, Example 1, and Example 2.

Figures 17, 18:
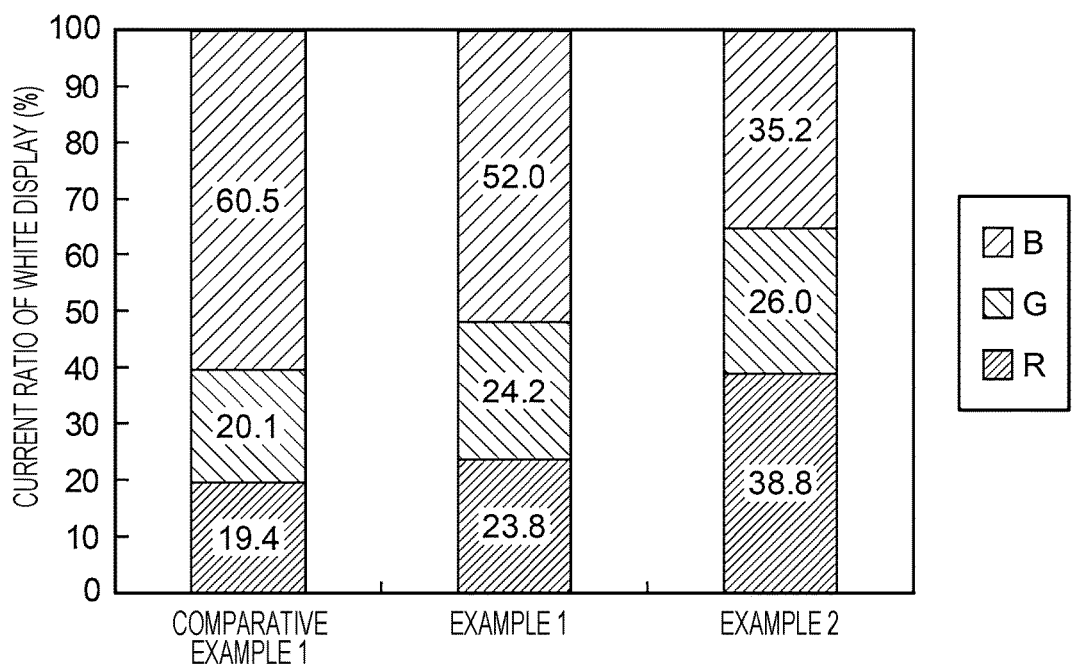
FIG. 17 is a table illustrating evaluation results of Comparative Example 1, Example 1 and Example 2.
FIG. 18 is a graph illustrating a current ratio in the luminescence pixel according to Comparative Example 1, Example 1, and Example 2.

FIG. 17 is a table illustrating evaluation results of Comparative Example 1, Example 1 and Example 2, FIG. 18 is a graph illustrating a current ratio in the luminescence pixel according to Comparative Example 1, Example 1, and Example 2.

As shown in FIG. 17, when white color is displayed, the current consumptions in the luminescence pixels 20B, 20G, and 20R [mA] are as follows.

In Comparative Example 1, a current consumption for blue (B) was 48.5 mA, a current consumption for green (G) was 16.1 mA, and a current consumption for red (R) was 15.6 mA.

In Example 1, a current consumption for blue (B) was 39.3 mA, a current consumption for green (G) was 18.3 mA, and a current consumption for red (R) was 17.9 mA.

In Example 2, a current consumption for blue (B) was 38.8 mA, a current consumption for green (G) was 28.6 mA, and a current consumption for red (R) was 42.8 mA.

That is, in a case where the white color with desired chromaticity was displayed, it was necessary to flow a current which was two or more times the current flowing through other luminescence pixels 20G and 20R through the luminescence pixel 20B in Comparative Example 1. On the other hand, the current flowing the luminescence pixel 20B was reduced, so the current flowing the luminescence pixels 20G and 20R was increased in Example 1 and Example 2. Thus, as shown in FIG. 18, the current ratio was B:G:R=0.6: 0.2:0.19≈3:1:1 in Comparative Example 1, the current ratio was B:G:R=0.52:0.24:0.24≈2:1:1 in Example 1, and the current ratio was B:G:R=0.35:0.26:0.39≈1:1:1 in Example 2. That is, by the configuration of the optical path length adjustment layer 28 including the luminance adjustment layer, the difference in the current consumption between the luminescence pixels 20B, 20G, and 20R can be reduced, or the current ratio can be uniform.

As shown in FIG. 17, the luminance lifetime (LT 80 (H)) showing a conduction time at which the luminance becomes 80% with respect to the luminance in an initial state when light of white color is displayed is substantially equal to a case of Comparative Example 1 and Example 1, and the luminance lifetime in Example 2 becomes shorter than the case of Example 1 by increase of current consumption. Meanwhile, as a chrominance (deviation of chromaticity) of display of white color when the luminance becomes 80% with respect to the initial state when obtaining the Δu'v' based on CIE 1976 UCS chromaticity diagram, Δu'v' is 0.041 in Comparative Example 1, Δu'v' is 0.030 in Example 1, and Δu'v' is 0.010 in Example 2, so a state of Example 2 is a most preferable condition. Therefore, by uniformizing of the current ratios in the luminescence pixels 20B, 20G, and 20R, it is possible to maintain the display of white color with a desired chromaticity although the luminance is decreased when displaying white color.

Third Embodiment

Electronic Equipment

Figure 19:
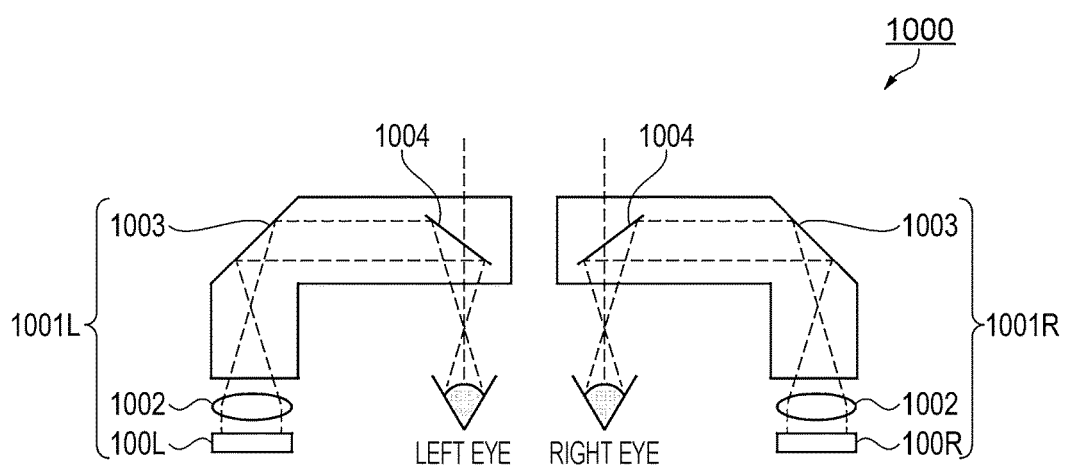
FIG. 19 is a schematic diagram illustrating a head mount display as electronic equipment.

Next, an example of the electronic equipment to which the organic EL device 100 of this embodiment is applied will be described with reference to FIG. 19. FIG. 19 is a schematic diagram illustrating a head mount display as the electronic equipment.

The head mount display (HMD) 1000 includes a pair of optical units 1001L and 1001R for displaying information corresponding to left and right eyes, a mounting unit (not shown) for mounting a pair of the optical units 1001L and 1001R on a head of an user, a power supply unit, and a control unit (not shown). Here, the pair of optical units 1001L and 1001R has a bilaterally symmetrical configuration, so the optical unit 1001R for the right eye will be described as an example.

The optical unit 1001R includes a display unit 100R to which the organic EL device 100 of the embodiment is applied, a condensing optical system 1002, and a light guide member 1003 which is bent in an L-shape. A half mirror layer 1004 is provided in the light guide member 1003. Display light emitted from the display unit 100R in the optical unit 1001R is incident on the light guide member 1003 by the condensing optical system 1002, is reflected by the half mirror layer 1004, and is guided to the right eye. The display light (image) projected to the half mirror layer 1004 is a virtual image. Accordingly, the user can visually recognize both the display (virtual image) of the display unit 100R and the external side ahead of the half mirror layer 1004. The HMD 1000 is a projection type-display device of transmission type (see-through type).

The light guide member 1003 forms a rod integrator by a combination of rod lenses. The condensing optical system 1002 and the display unit 100R are disposed on the side of the light guide member 1003 on which light is incident, and the rod lenses are configured to receive the display light condensed by the condensing optical system 1002. The half mirror layer 1004 of the light guide member 1003 has an angle at which the light condensed by the condensing optical system 1002 and transmitted by total reflection within the rod lens is reflected toward the right eye.

The display unit 100R can display a display signal transmitted from the control unit as image information such as characters or images. The displayed image information is converted from a real image into the virtual image by the condensing optical system 1002.

As described above, the optical unit 1001L for the left eye also includes a display unit 100L to which the organic EL device 100 of the embodiment is applied, and the configuration and the function of the optical unit 1001L are same as optical unit 1001R for the right eye.

According to this embodiment, since the organic EL device 100 of the above embodiment is applied as the display units 100L and 100R, the HMD 1000 of the see-through type can be provided in which chromaticity deviation in the white display is difficult to occur even in the case of being in use for a long period of time and reliability and quality are also high.

The HMD 1000 to which the organic EL device 100 of the embodiment is applied is not limited to be configurated to include the pair of optical units 1001L and 1001R corresponding to both eyes, and for example, may be configured to include the optical unit 1001R of the pair of optical units 1001L and 1001R. Further, the HMD 1000 is not limited to the see-through type, may be a immersive type that visually recognizes the display in a state of shielding external light. The organic EL device 200 of the second embodiment may be applied to the display units 100L and 100R.

The invention is not limited to the embodiments described above, the invention can be appropriately changed without departing from the essence or thought of the invention read from claims and the entire specification, and the electro-optical device with such changes and the electronic equipment to which the electro-optical device is applied are also included in the technical scope of the invention. Various modification examples also can be considered in addition to the embodiments. Hereinafter, the modification examples will be described.

MODIFICATION EXAMPLE 1

The configuration of the insulation layer 28 in the luminescence pixel 20G is not limited to the configuration including the fourth insulation layer 27b in addition to the second insulation layer 26. For example, the configuration may include the third insulation layer 27a instead of the fourth insulation layer 27b. That is, the third insulation layer 27a may be formed over the luminescence pixels 20G and 20R, the fourth insulation layer 27b may be formed in correspondence with the luminescence pixel 20R.

MODIFICATION EXAMPLE 2

The organic EL elements 30B, 30G, and 30R of the luminescence pixels 20B, 20G, and 20R is not limited to the configuration in which white light is obtained from the functional layer 35. The invention can also be applied to the configuration in which light of the color corresponding to each of the organic EL elements 30B, 30G, and 30R is obtained. Also, the invention can be applied to the organic EL device which does not include the color filter 50.

MODIFICATION EXAMPLE 3

The reflective layer is not limited to be configured with a power supply line 14 in the organic EL device 100 of this embodiment. The reflective layer which is electrically independent may be provided in an underlayer of the pixel electrode 31 using a material having photoreflectance separately from the power supply line 14. According to this, the reflective layer can be freely disposed with respect to the luminescence pixels 20B, 20G, and 20R.

MODIFICATION EXAMPLE 4

The electronic equipment to which the organic EL device 100 of the embodiment is applied is not limited to the HMD 1000. For example, the organic EL device 100 of the embodiment can be suitably used in a display unit such as a head-up display (HUD), an electronic view finder (EVF), a portable information terminal.

The entire disclosure of Japanese Patent Application No. 2016-023398, filed Feb. 10, 2016 is expressly incorporated by reference herein.

What is claimed is:
1. An electro-optical device comprising:
a reflective layer;
a semitransparent reflective layer; and
a first pixel and a second pixel respectively having an optical path length adjustment layer and a luminescence functional layer provided between the reflective layer and the semitransparent reflective layer; wherein
the optical path length adjustment layer of the first pixel includes a first luminance adjustment layer having a first thickness,
the optical path length adjustment layer of the second pixel includes the first luminance adjustment layer and a second luminance adjustment layer having a second thickness, and
the first thickness of the first luminance adjustment layer is different from the second thickness of the second luminance adjustment layer.
2. The electro-optical device according to claim 1, wherein
the luminance adjustment layer includes a layer with a lower refractive index than the refractive indexes of adjacent layers.
3. The electro-optical device according to claim 2, wherein
the adjacent layers are made of a silicon nitride film, and the layer with the lower refractive index is made of a silicon oxide film.
4. An electronic equipment comprising:
electro-optical device according to claim 3.

5. An electronic equipment comprising:
the electro-optical device according to claim 2.

6. The electro-optical device according to claim 2, wherein
the luminance adjustment layer of the first pixel includes the layer with the lower refractive index than the refractive indexes of adjacent layers of the second pixel.

7. The electro-optical device according to claim 1, wherein
the luminance adjustment layer includes the layer with the lower refractive index than the refractive indexes of the adjacent layers and a metal layer.

8. The electro-optical device according to claim 7, wherein
the metal layer is made of at least one metal selected from among Ti, Mo, Ta, Al, Cu, and Cr, or an alloy of these metals.

9. An electronic equipment comprising:
electro-optical device according to claim 8.

10. An electronic equipment comprising:
the electro-optical device according to claim 7.

11. The electro-optical device according to claim 1, wherein
the first pixel and the second pixel include a reflection-increasing layer provided on the reflective layer.

12. An electronic equipment comprising:
the electro-optical device according to claim 11.

13. An electronic equipment comprising:
the electro-optical device according to claim 1.

14. The electro-optical device according to claim 1, further comprising:
a pixel electrode, the pixel electrode and the optical path adjustment layer being disposed in different layers of the electro-optical device.

15. The electro-optical device according to claim 14, wherein
the luminance adjustment layer is provided between the reflective layer and the pixel electrode.

16. An electronic equipment comprising:
the electro-optical device according to claim 15.

* * * * *